(12) United States Patent
Chen

(10) Patent No.: US 11,887,685 B2
(45) Date of Patent: Jan. 30, 2024

(54) FAIL BIT REPAIR METHOD AND DEVICE

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 288 days.

(21) Appl. No.: 17/446,978

(22) Filed: Sep. 6, 2021

(65) Prior Publication Data
US 2022/0059182 A1 Feb. 24, 2022

Related U.S. Application Data

(63) Continuation of application No. PCT/CN2021/099159, filed on Jun. 9, 2021.

(30) Foreign Application Priority Data

Aug. 18, 2020 (CN) .......................... 202010833678.3

(51) Int. Cl.
G11C 29/38 (2006.01)
G11C 29/44 (2006.01)
(Continued)

(52) U.S. Cl.
CPC ...... *G11C 29/4401* (2013.01); *G11C 29/1201* (2013.01); *G11C 29/38* (2013.01);
(Continued)

(58) Field of Classification Search
CPC . G11C 29/4401; G11C 29/1201; G11C 29/38; G11C 29/785; G11C 2029/1202; G11C 2029/1204; G11C 29/76
See application file for complete search history.

(56) References Cited

U.S. PATENT DOCUMENTS 6,535,993 B1 * 3/2003 Hamada ................. G11C 29/56
714/42
6,741,509 B2 5/2004 Kato
(Continued)

FOREIGN PATENT DOCUMENTS

CN 1195814 A 10/1998
CN 1366308 A 8/2002
(Continued)

OTHER PUBLICATIONS

Written Opinion of the International Search Authority in the international application No. PCT/CN2021/099159, dated Sep. 8, 2021.
(Continued)

*Primary Examiner* — Xiaochun L Chen
(74) *Attorney, Agent, or Firm* — Syncoda LLC; Feng Ma

(57) ABSTRACT

A Fail Bit (FB) repair method and device can be applied to repairing an FB in a chip. The method includes: a bank to be repaired including multiple target repair regions in a chip to be repaired is determined; first repair processing is performed on a first FB in each target repair region by using a redundant circuit; a second FB position determination step is executed to determine a bit position of a second FB, and second repair processing is performed on the second FB; unrepaired FBs in each target repair region is determined, and the second FB position determination step is recursively executed to obtain a test repair position of each unrepaired FB to perform third repair processing on the unrepaired FB according to the test repair position.

19 Claims, 9 Drawing Sheets

(51) Int. Cl.
*G11C 29/12* (2006.01)
*G11C 29/00* (2006.01)

(52) U.S. Cl.
CPC .... *G11C 29/785* (2013.01); *G11C 2029/1202* (2013.01); *G11C 2029/1204* (2013.01)

(56) References Cited

U.S. PATENT DOCUMENTS

| | | |
|---|---|---|
| 6,876,588 B2 | 4/2005 | Kato |
| 7,079,432 B2 | 7/2006 | Kato |
| 7,224,596 B2 | 5/2007 | Jeong |
| 10,446,253 B2 | 10/2019 | Choi |
| 2001/0009521 A1 | 7/2001 | Hidaka |
| 2001/0026486 A1 | 10/2001 | Ogawa |
| 2002/0001896 A1 | 1/2002 | Yoon |
| 2002/0114198 A1 | 8/2002 | Kato |
| 2002/0191454 A1 | 12/2002 | Beer |
| 2003/0191991 A1 | 10/2003 | Hsu |
| 2004/0062134 A1 | 4/2004 | Kato |
| 2004/0210803 A1 | 10/2004 | Cheng |
| 2005/0122802 A1 | 6/2005 | Kato |
| 2006/0090058 A1 | 4/2006 | Chng |
| 2006/0098503 A1 | 5/2006 | Jeong |
| 2007/0247937 A1 | 10/2007 | Moriyama |
| 2009/0119537 A1 | 5/2009 | Lee |
| 2010/0157656 A1 | 6/2010 | Tsuchida |
| 2010/0169705 A1 | 7/2010 | Fujii |
| 2010/0322024 A1 | 12/2010 | Yagishita |
| 2011/0002169 A1 | 1/2011 | Li |
| 2011/0199845 A1 | 8/2011 | Yang |
| 2012/0173932 A1 | 7/2012 | Li |
| 2012/0206973 A1 | 8/2012 | He |
| 2012/0257467 A1 | 10/2012 | Kosugi |
| 2012/0275249 A1 | 11/2012 | Yang |
| 2012/0297245 A1 | 11/2012 | Li |
| 2013/0173970 A1 | 7/2013 | Kleveland |
| 2014/0146613 A1 | 5/2014 | Yang et al. |
| 2014/0219023 A1 | 8/2014 | Li et al. |
| 2015/0066417 A1 | 3/2015 | Kimura |
| 2015/0178614 A1 | 6/2015 | Lin |
| 2015/0248322 A1 | 9/2015 | Hara et al. |
| 2016/0005452 A1 | 1/2016 | Bae |
| 2016/0351276 A1 | 12/2016 | Shim |
| 2017/0110206 A1 | 4/2017 | Ryu et al. |
| 2018/0182467 A1 | 6/2018 | Kang et al. |
| 2019/0164621 A1 | 5/2019 | Kim |
| 2019/0237154 A1 | 8/2019 | Choi |
| 2019/0287641 A1 | 9/2019 | Ko |
| 2019/0348100 A1 | 11/2019 | Smith et al. |
| 2019/0348102 A1 | 11/2019 | Smith et al. |
| 2020/0152285 A1 | 5/2020 | Nakaoka |
| 2020/0243159 A1 | 7/2020 | Kang et al. |
| 2022/0058079 A1 | 2/2022 | Chen |
| 2022/0058080 A1 | 2/2022 | Chen |
| 2022/0059182 A1 | 2/2022 | Chen |
| 2022/0270668 A1 | 8/2022 | Li et al. |
| 2022/0310187 A1 | 9/2022 | Chen |
| 2022/0317908 A1 | 10/2022 | Chen |

FOREIGN PATENT DOCUMENTS

| | | |
|---|---|---|
| CN | 1404140 A | 3/2003 |
| CN | 1409323 A | 4/2003 |
| CN | 1467746 A | 1/2004 |
| CN | 101329918 A | 12/2008 |
| CN | 101331554 A | 12/2008 |
| CN | 101630337 A | 1/2010 |
| CN | 101765889 A | 6/2010 |
| CN | 102157203 A | 8/2011 |
| CN | 101765889 B | 12/2013 |
| CN | 103473160 A | 12/2013 |
| CN | 103688247 A | 3/2014 |
| CN | 103871447 A | 6/2014 |
| CN | 105787817 A | 7/2016 |
| CN | 109753374 A | 5/2019 |
| CN | 110010187 A | 7/2019 |
| CN | 110364214 A | 10/2019 |
| CN | 110797071 A | 2/2020 |
| CN | 110797072 A | 2/2020 |
| CN | 110879931 A | 3/2020 |
| CN | 110968985 A | 4/2020 |
| CN | 111312321 A | 6/2020 |
| CN | 112216621 A | 1/2021 |
| CN | 112885398 A | 6/2021 |
| CN | 112908402 A | 6/2021 |
| CN | 112908403 A | 6/2021 |
| EP | 1217524 A2 | 6/2002 |
| JP | 2000048596 A | 2/2000 |
| JP | 2008084409 A | 4/2008 |
| KR | 100795520 B1 | 1/2008 |
| TW | 376558 B | 12/1999 |
| TW | 470964 B | 1/2002 |
| TW | 201110132 A | 3/2011 |
| TW | 201642273 A | 12/2016 |

OTHER PUBLICATIONS

Written Opinion of the International Search Authority in the international application No. PCT/CN2021/099149, dated Sep. 7, 2021.
First Office Action of the U.S. Appl. No. 17/464,886, dated Feb. 21, 2023.
First Office Action of the U.S. Appl. No. 17/462,042, dated Mar. 2, 2023.
Written Opinion of the International Search Authority in the international application No. PCT/CN2021/099146, dated Sep. 7, 2021.
Written Opinion of the International Search Authority in the international application No. PCT/CN2021/099173, dated Aug. 26, 2021.
First Office Action of the U.S. Appl. No. 17/445,300, dated Mar. 2, 2023.
International Search Report in the international application No. PCT/CN2021/109442, dated Jan. 4, 2022.
Notice of Allowance of the Chinese application No. 202110352509.2, dated Apr. 15, 2022.
International Search Report in the international application No. PCT/CN2021/109515, dated Dec. 30, 2021.
Notice of Allowance of the Chinese application No. 202110352499.2, dated Apr. 15, 2022.
First Office Action of the U.S. Appl. No. 17/515,776, dated Mar. 3, 2023.
International Search Report in the international application No. PCT/CN2021/109464, dated Dec. 30, 2021.
Notice of Allowance of the Chinese application No. 202110327478.5, dated Apr. 25, 2022.
Kristofik Stefan et al: "Enhancement of fault collection for embedded RAM redundancy analysis considering intersection and orphan faults", Integration, The VLSI Journal, North-Holland Publishing Company. Amsterdam, NL, vol. 62, Mar. 13, 2018 (Mar. 13, 2018), pp. 190-204, XP085401084.
Wey C-L et al: "On the Repair of Redundant RAM's", IEEE Transactions on Computer-Aided Design of Integrated Circuits and Systems, IEEE, USA, vol. CAD-06, No. 2, Mar. 1, 1987 (Mar. 1, 1987), pp. 222-231, XP000097484.
First Office Action of the European application No. 21773439.1, dated Feb. 24, 2023.
International Search Report in the international application No. PCT/CN2021/099159, dated Sep. 8, 2021.
International Search Report in the international application No. PCT/CN2021/099149, dated Sep. 7, 2021.
International Search Report in the international application No. PCT/CN2021/099146, dated Sep. 7, 2021.
International Search Report in the international application No. PCT/CN2021/099173, dated Aug. 26, 2021.
Supplementary European Search Report in European Application No. 21773439.1, dated Jun. 27, 2022.
Non-Final Office Action of the U.S. Appl. No. 17/648,665, dated Aug. 28, 2023, 67 pages.

(56) References Cited

OTHER PUBLICATIONS

Notice of Allowance of the U.S. Appl. No. 17/568,948, dated Aug. 30, 2023, 60 pages.
Notice of Allowance of the U.S. Appl. No. 17/445,300, dated Aug. 17, 2023, 65 pages.

* cited by examiner

FAIL BIT REPAIR METHOD AND DEVICE

CROSS-REFERENCE TO RELATED APPLICATIONS

This application is a continuation of International Patent Application No. PCT/CN2021/099159 filed on Jun. 9, 2021, which claims priority to Chinese Patent Application No. 202010833678.3 filed on Aug. 18, 2020. The disclosures of these applications are hereby incorporated by reference in their entirety.

BACKGROUND

With the rapid development of computer technologies, integrated circuit chip has played an increasingly important role in people's production and life. However, failure problems are inevitable during development, production, and use of chips, and redundant circuits may usually be adopted for repair processing of FBs in the chips.

It is to be noted that the information disclosed in the "background" is only used to strengthen the understanding to the background of the present disclosure and thus may include information that does not form the conventional art known to those ordinary skilled in the art.

SUMMARY

The present disclosure relates generally to the technical field of integrated circuits, and more specifically to a Fail Bit (FB) repair method and an FB repair device.

According to an aspect of the present disclosure, an FB repair method is provided, which can include: a bank to be repaired of a chip to be repaired is determined, the bank to be repaired including multiple target repair regions; first repair processing is performed on a first FB in each target repair region by using a redundant circuit; after first repair processing is performed, a second FB position determination step is executed to determine a bit position of a second FB in each target repair region, and second repair processing is performed on the second FB according to the bit position of the second FB; and unrepaired FBs in each target repair region are determined, and the second FB position determination step is recursively executed to obtain a test repair position of each unrepaired FB to perform third repair processing on the unrepaired FB according to the test repair position.

The present disclosure also discloses an FB repair device, which may include a bank determination module, configured to determine a bank to be repaired of a chip to be repaired, the bank to be repaired including multiple target repair regions; a first repair processing module, configured to perform first repair processing on a first FB in each target repair region by using a redundant circuit; a second repair processing module, configured to, after first repair processing is performed, execute a second FB position determination step to determine a bit position of a second FB in each target repair region, and perform second repair processing on the second FB according to the bit position of the second FB; and a third repair processing module, configured to determine unrepaired FBs in each target repair region, and recursively execute the second FB position determination step to obtain a test repair position of each unrepaired FB to perform third repair processing on the unrepaired FB according to the test repair position.

It is to be understood that the above general description and the following detailed description are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the application and, together with the specification, serve to explain the principle of the present disclosure. It is apparent that the drawings in the following descriptions are only some embodiments of the application, and those ordinary skilled in the art may also obtain other drawings according to these drawings without creative efforts. In the drawings.

DETAILED DESCRIPTION

In order to make the objectives, features, and advantages of the present disclosure clearer and easier to understand, the present disclosure will further be described below in detail in combination with the drawings and specific implementations.

If presently available redundant circuits include more than one allocation that may really repair all FBs, it is considered that there is really a solution to redundant-circuit-based BF repair. When there is really a solution, at least one allocation solution may definitely be found. This is an optimal allocation method. A present redundant circuit allocation method is non-optimal.

Failure problems are inevitable during development, production, and use of chips, and redundant circuits may usually be adopted for repair processing of FBs in the chips. However, a present redundant circuit allocation method is non-optimal. For example, a Dynamic Random-Access Memory (DRAM) may be divided into a cell region and a periphery region. The cell region includes many storage cells, so the storage cells may be divided into banks.

Redundant circuits may be divided into two types of orthogonal straight lines, i.e., Redundant Bit-Lines (RBLs) and Redundant Word-Lines (RWLs). Repair ranges when redundant circuits repairs FBs are half-banks, and are limited in quantity. Multiple banks are divided in a chip, and if not all FBs in a half-bank of only one repair range repaired successfully, the chip is scrapped. At present, a common allocation method includes preferentially allocating RBLs for repair, and allocating RWLs for repair when there are no enough RBLs. When the existing allocation method is adopted, if there is a really solution, an allocation result may usually not repair all FBs successfully, resulting in scrapping of the whole chip and greatly reducing the yield.

Figure 1:
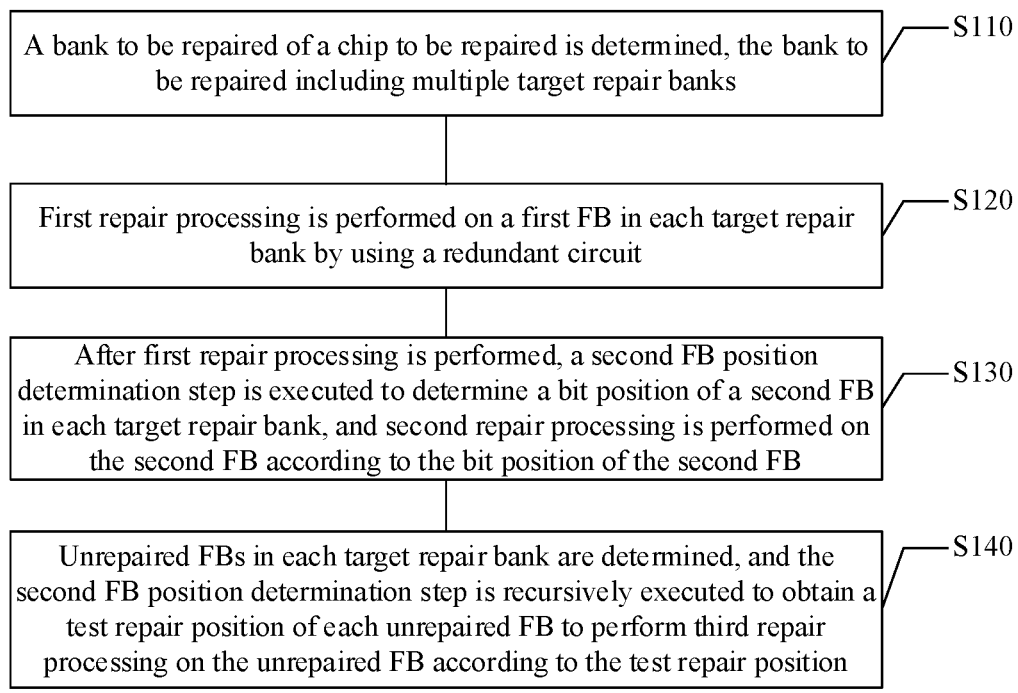
FIG. 1 schematically shows a flowchart of an FB repair method according to an exemplary implementation of the present disclosure.

Based on this, there is provided in an exemplary embodiment an FB repair method at first. FIG. 1 schematically shows a flowchart of an FB repair method according to some embodiments of the present disclosure. Referring to FIG. 1, the FB repair method may include the following operations.

In S110, a bank to be repaired of a chip to be repaired is determined, the bank to be repaired including multiple target repair regions.

In some exemplary embodiments of the present disclosure, the chip to be repaired may be a chip with FBs in a cell region. The bank to be repaired may be a bank with FBs in a storage cell. A repair range of the bank to be repaired may usually be a half-bank. The target repair region may be multiple banks formed after the bank to be repaired is divided. A bank to be repaired may be divided into multiple target repair regions.

When an optimal allocation method of redundant circuits for a certain repair range in the chip is determined, the chip to be repaired may be acquired at first, and a bank to be repaired of the chip to be repaired is determined for repair processing by using a redundant circuit.

Figure 2:
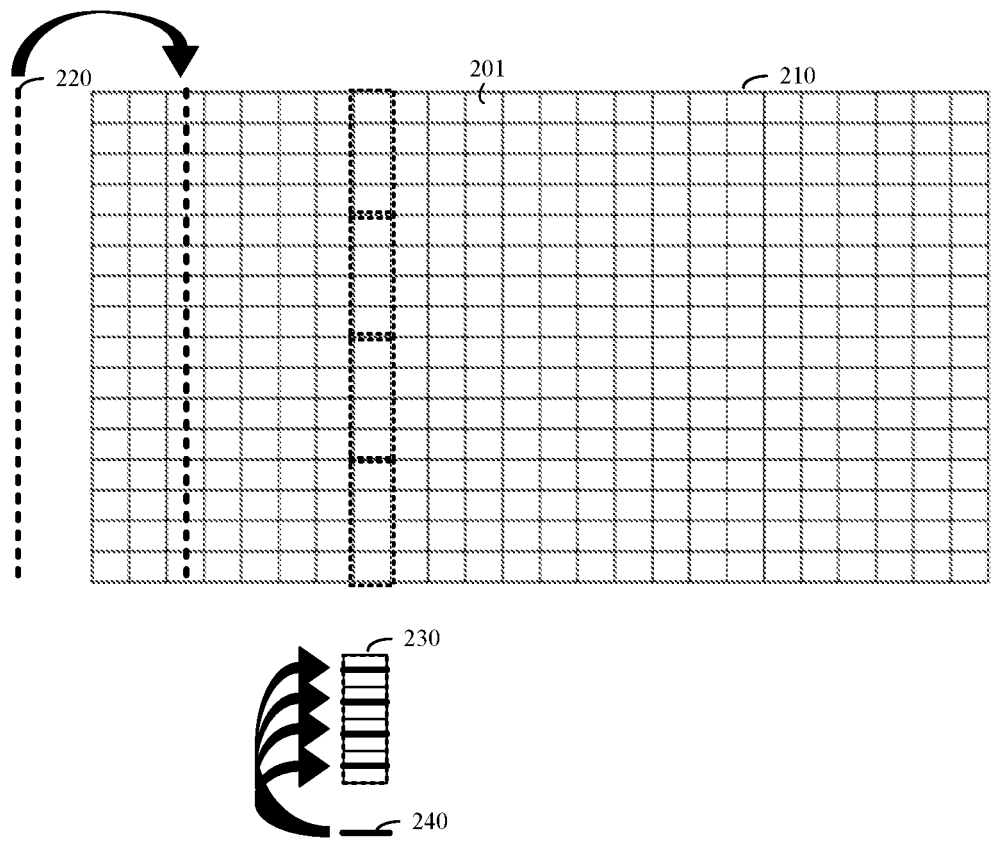
FIG. 2 schematically shows a line diagram of an initial bank to be repaired half-bank according to an exemplary implementation of the present disclosure.

References are made to FIG. 2. FIG. 2 schematically shows a line diagram of an initial bank to be repaired half-bank according to an exemplary implementation of the present disclosure. In FIG. 2, taking an initial bank to be repaired half-bank as an example, the initial bank to be repaired 210 may include multiple Data Queues (DQs) 201. Specifically, vertical and horizontal lines in the half-bank (210) may be represented by Word Lines (WLs) and Bit Lines (BLs) respectively. For example, a length of the WL may be continuous bits of 16 vertical continuous DQs, and a length of the BL may be continuous bits of one horizontal DQ. Rules for allocating redundant circuits to repair FBs are as follows. For RWLs 220, a repair range 210, i.e., a half-bank, includes $N_{RWL}$ RWLs, one RWL may be allocated to repair any WL in the half-bank, and a width of an RWL may be $w^{RWL}$, bits. For RBLs 240, vertical 4-DQ may be determined as a repair range 230, namely four continuous DQs may be determined as a repair range, every 4-DQ includes $N_{RBL}$ RBLs, and allocating the RBLs to repair BLs satisfies an appositional repair rule, namely one RBL may be allocated to repair any BL in the corresponding 4-DQ, BLs at the same positions in other DQs may also be repaired together, and allocated repair over non-corresponding 4-DQs is not allowed. A width of an RBL may be $w^{RBL}$ bits.

It is to be noted that specific numerical values of $N_{RWL}$, $N_{RBL}$, $w^{RWL}$, and $w^{RBL}$ in the present disclosure are determined according to a product feature of the chip, and no special limits are made thereto in the present disclosure.

According to some exemplary embodiments of the present disclosure, an initial bank to be repaired of the chip to be repaired is determined, the initial bank to be repaired including an initial WL and an initial BL. A WL compression ratio and BL compression ratio of the initial bank to be repaired are acquired. Compression processing is performed on the initial WL according to the WL compression ratio, and compression processing is performed on the initial BL according to the BL compression ratio, to form the bank to be repaired. The initial bank to be repaired may be a repair bank determined when repair processing is performed on the chip to be repaired. The initial WL may be a WL circuit in the initial bank to be repaired. The initial BL may be a BL circuit in the initial bank to be repaired. The WL compression ratio may be a compression ratio adopted for performing compression processing on the initial WLs in the initial bank to be repaired. The BL compression ratio may be a compression ratio adopted for performing compression processing on the initial BLs in the initial bank to be repaired. The bank to be repaired may be a repair bank formed after compression processing is performed on the initial bank to be repaired.

Figure 3:
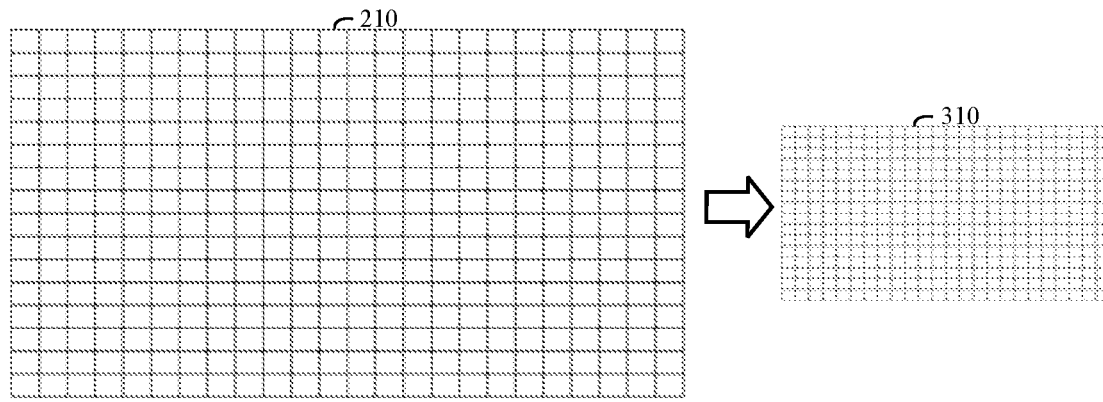
FIG. 3 schematically shows a change chart of performing compression processing on an initial bank to be repaired to form a bank to be repaired according to an exemplary implementation of the present disclosure.

Before repair processing is performed on the chip to be repaired, for weakening the factor of the widths of the RWL and the RBL to make it unnecessary to consider the width of the redundant circuit during subsequent processing, in S301, compression processing may be performed on the initial bank to be repaired to form the bank to be repaired for a repair processing process. References are made to FIG. 3. FIG. 3 schematically shows a change chart of performing compression processing on an initial bank to be repaired to form a bank to be repaired according to an exemplary implementation of the present disclosure. For example, the WL compression ratio and the BL compression ratio may be configured as $w^{RWL}$ and $w^{RBL}$ respectively. In FIG. 3, compression processing is performed on the initial WL and initial BL in the initial bank to be repaired 210 according to the WL compression ratio $w^{RWL}$ and the BL compression ratio $w^{RBL}$ respectively. When compression processing is performed, an OR operation may be performed. A value of an FB may be 1, and a value of a non-FB may be 0. After compression processing is performed on the initial bank to be repaired 210, the bank to be repaired 310 may be formed, and the bank to be repaired is recorded as U. Performing the abovementioned compression processing process on the initial bank to be repaired to form the bank to be repaired may greatly reduce the number of bits in the original half-bank, reduce the processing time, and improve the processing efficiency.

According to some exemplary embodiments of the present disclosure, a division column of the bank to be repaired is determined, a width of the division column being determined according to a number of row-direction equivalent bits in a DQ after compression processing. Column division processing is performed on the bank to be repaired according to the division column to form the multiple target repair regions. The division column may be a basic division unit adopted when division processing is performed on the initial bank to be repaired. The row-direction equivalent bits may be bits in each row in the DQ in the bank to be repaired formed after compression processing is performed on the initial bank to be repaired.

Figure 4:
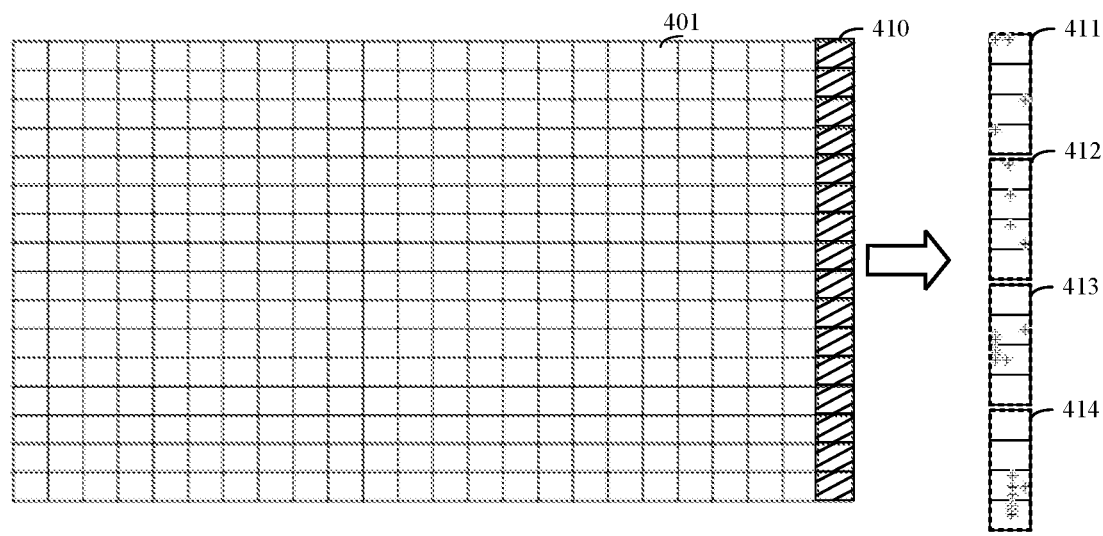
FIG. 4 schematically shows an FB map of a target repair region according to an exemplary implementation of the present disclosure.

References are made to FIG. 4. FIG. 4 schematically shows an FB map of a target repair region according to an exemplary implementation of the present disclosure. In FIG. 4, the bank to be repaired 410 may include multiple DQs 401. For example, in the present disclosure, the division column of the bank to be repaired may be determined according to the width of the row-direction equivalent bits in the DQ. For example, a width of a vertical DQ 401 may be determined as the width of the division column, and all vertical DQs may be divided into a target repair region. After the bank to be repaired is divided according to the division column, the target repair region may be a bank formed by a row-direction DQ and all the vertical DQs. When column division processing is performed on the bank to be repaired according to the width of a row-direction equivalent bit, the bank to be repaired may be divided into the multiple target repair regions 410 to perform repair processing based on the target repair regions, so that the complexity of performing repair processing on the FBs by using the redundant circuit may be reduced.

In S120, first repair processing is performed on a first FB in each target repair region by using a redundant circuit.

In some exemplary implementations of the present disclosure, the redundant circuit may include an RWL and an RBL. First repair processing may be a process of performing repair processing on the FB by using the RWL and the RBL after the FB in the target repair region is determined. First repair processing, also called Must Repair (MR), may represent a repair process that one of the RBL or the RWL must be used for repair and cannot be replaced with the other.

Referring to FIG. 4, repair processing may be performed on the target repair regions one by one. For example, banks to be processed 410, i.e., banks $A_r$, r=1, 2, . . . , n, may be sequentially selected from right to left, n being the number of the target repair regions, and repair processing is performed on the target repair regions one by one. FB may be adopted to represent a fail bit in the target repair region, namely a value thereof is 1, and non-FB may be adopted to represent a not fail bit in the target repair region, namely a value thereof is 0.

According to some exemplary embodiments of the present disclosure, an FB feature map of the target repair region is determined. First repair processing is performed on an FB in each target repair region using an RWL and/or an RBL according to the FB feature map. The FB feature map may be a feature map obtained after abstract extraction is performed on the FB in the target repair region.

After the multiple target repair regions are generated, one target repair region may be selected, and an FB feature map of the target repair region may be generated. First repair processing is performed on the FB in the target repair region by using the RWL and/or the RBL according to the FB feature map.

According to some exemplary embodiments of the present disclosure, the target repair region is divided into multiple basic repair banks, the basic repair bank including a preset number of DQs. The basic repair banks are acquired, and bit states of all bits in the basic repair banks are determined. OR operation processing is performed on the bit states in the preset number of DQs, and FB maps of the basic repair banks are generated by merging. The FB feature map is generated according to the FB maps corresponding to respective basic repair banks. The basic repair bank may be a repair bank formed after bank division processing is performed on the target repair region. The basic repair bank may include a preset number of DQs, and the preset number may be set according to a division requirement. For example, the preset number may be configured to 2, 4, and 8. No special limits are made thereto in the present disclosure. The bit state may represent that each bit in the basic repair bank is in a valid state or an invalid state. The FB map may be a feature map corresponding to each FB in the basic repair bank.

When an RBL is adopted for repair processing, the appositional repair rule is satisfied, namely one RBL may be allocated to repair any BL in the corresponding 4-DQ. Therefore, the preset number may be configured to 4, and four DQs are determined as a basic repair bank. For example, every four DQs may be determined as a basic repair bank, and $B_{ri}$ may be adopted to represent the basic repair bank, namely ith 4-DQ in $A_r$. When a target repair region is determined, the target repair region may be divided into multiple basic repair banks, and bit states of all bits in each basic repair bank are determined one by one. Referring to FIG. 4, "+" may be adopted to represent the FB in the basic repair bank. After the target repair region 410 is divided, four basic repair banks are obtained, i.e., basic repair bank 411, basic repair bank 412, basic repair bank 413, and basic repair bank 414.

Figure 5:
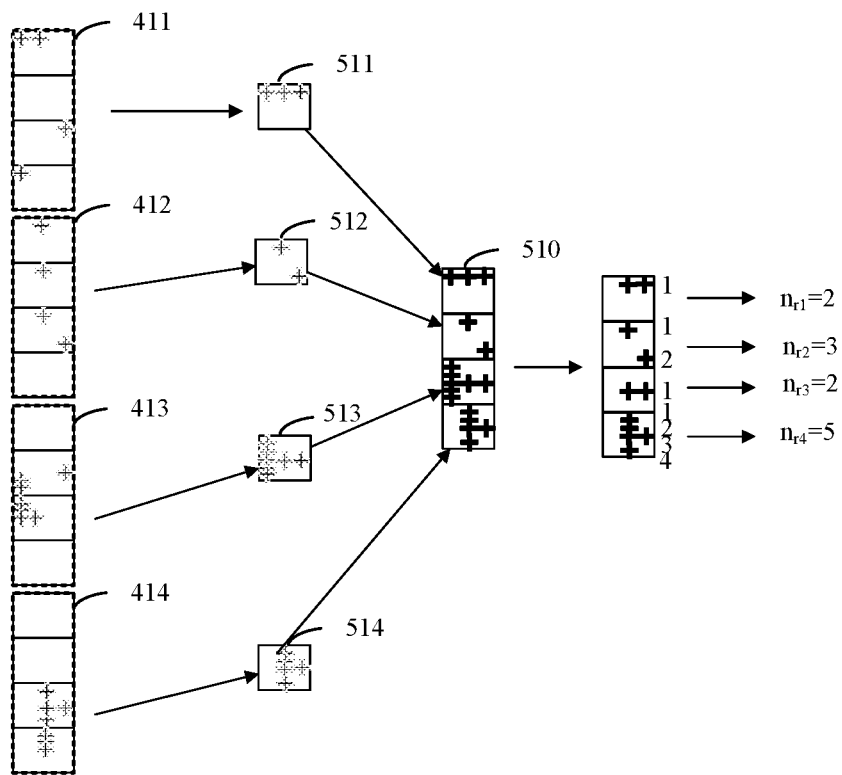
FIG. 5 schematically shows a generated FB feature map of a target repair region according to an exemplary implementation of the present disclosure.

When the bit states in each basic repair bank are determined, OR operation processing may be performed on the bit states in a basic repair bank, including 0 or 0=0, 0 or 1=1, 1 or 0=1, and 1 or 1=1. For $\forall B_{ri} \in A_r$, the OR operation may be performed on each DQ in $B_{ri}$ to obtain an FB map, recorded as $M_{ri}$, until such processing is performed on all $B_{ri}$ in $A_r$. References are made to FIG. 5. FIG. 5 schematically shows a generated FB feature map of a target repair region according to an exemplary implementation of the present disclosure. OR operation processing may be performed on FBs in basic repair bank 411 to basic repair bank 414 respectively to obtain corresponding FB maps, i.e., FB map 511, FB map 512, FB map 513, and FB map 514 respectively. An FB feature map 510 corresponding to the target repair region may be generated according to the FB map of each basic repair bank.

According to some exemplary embodiments of the present disclosure, a determination step is performed: whether the FB feature map satisfies a preset condition is determined, the preset condition including a first preset condition and a second preset condition. A first initial repair processing step is performed: if the FB feature map satisfies the first preset condition, repair processing is performed on the FB by using the RWL, the first preset condition including that an FB count of a first numbered WL in the basic repair bank is larger than a present remaining RBL count of the basic repair bank. A second initial repair processing step is performed: if the FB feature map satisfies the second preset condition, repair processing is performed on the FB using the RBL, the second preset condition including that an FB count of a first numbered BL in the basic repair bank is larger than a present remaining RWL count of the basic repair bank.

The preset condition may be a condition for determining the redundant circuit to be adopted to repair the target repair region according to the FB feature map corresponding to the target repair region. When repair processing is performed on the FB, two redundant circuits, i.e., the RWL and the RBL, may be adopted for repair processing. The first preset condition, i.e., a first phenomenon, may be a corresponding preset condition when the RWL is adopted to perform repair processing on the FB. The second preset condition, i.e., a second phenomenon, may be a corresponding preset condition when the RBL is adopted to perform repair processing on the FB. The FB count of the first numbered WL may be the number of FBs in a jth WL in $M_{ri}$, recorded as $N_{ij}^{FWL}$. The present remaining RBL count of the basic repair bank may be the number of present available RBLs in $M_{ri}$, recorded as $N_{ri}^{RBL}$. The FB count of the first numbered BL may be the number of FBs in a jth BL in $M_{ri}$, recorded as $N_{ij}^{FBLS}$. The present remaining RWL count may be the number of present remaining available RWLs, recorded as $N_{RWL}^{(t)}$.

Figure 6:
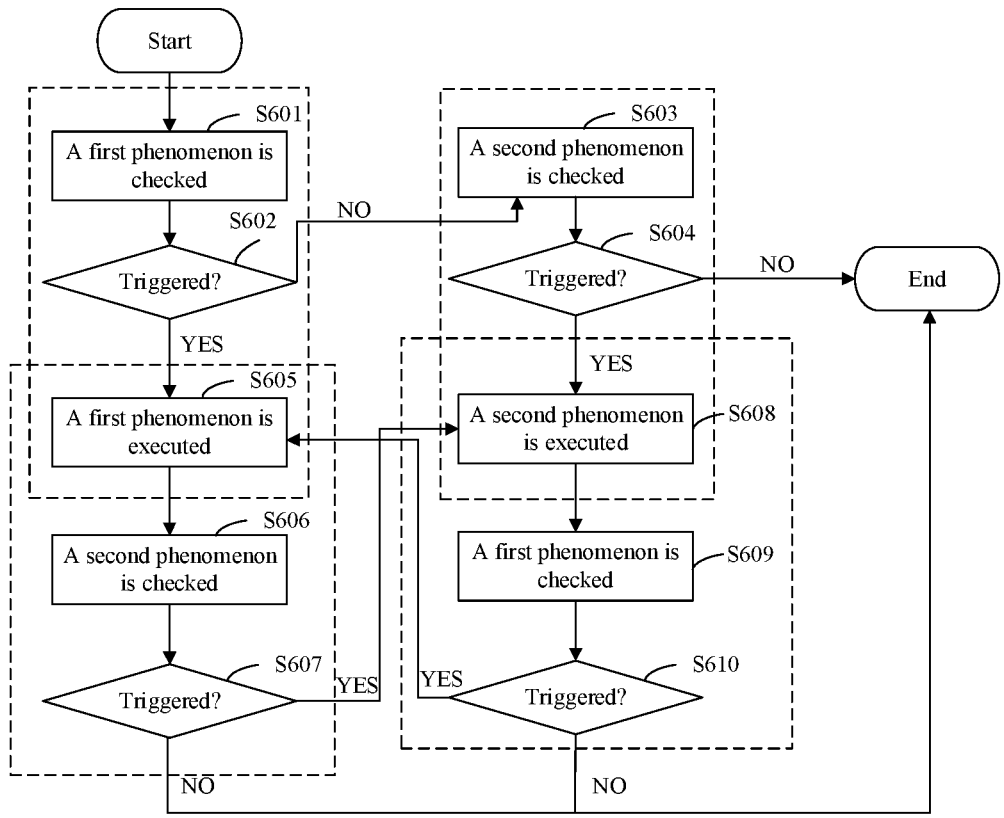
FIG. 6 schematically shows a flowchart of first repair processing according to an exemplary implementation of the present disclosure.

When the FB feature map of the target repair region is obtained, first repair processing may be performed on the FB in the target repair region by using the RWL and/or the RBL, namely Force Repair (FR) processing is performed. Referring to FIG. 6 which is a flowchart of first repair processing according to an exemplary implementation of the present disclosure, the following operations are specifically executed.

In S601 to S602, whether the determined FB feature map satisfies the first preset condition is determined. If the FB feature map does not satisfy the first preset condition, namely a first phenomenon is not triggered, S603 to S604 are executed, and whether a second phenomenon is triggered is determined. If it is determined that the FB feature map satisfies the first preset condition, namely a first phenomenon is triggered, S605 is executed, namely WL repair processing is performed on the target repair region. Specifically, the first preset condition may be that the FB count of the first numbered WL in the basic repair bank is larger than the present remaining RBL count of the basic repair bank. For each basic repair bank in the target repair region, namely $N_{ij}^{FWL} \in \forall M_{ri}$, when $N_{ij}^{FWL} > N_{ri}^{FBL}$, the WL at corresponding position j is repaired by using the RWL. When WL repair is performed by using the RWL, the present remaining RWL count correspondingly decreases by 1, so the present remaining RWL count may be correspondingly updated when WL repair is performed, namely $N_{RWL}^{(t+1)} = N_{RWL}^{(t)} - n_{RWL}^{(t)}$, where $N_{RWL}^{(t)}$ represents the number of the remaining available RWLs, t represents a present variable, t+1 represents a next variable, and $n_{RWL}^{(t)}$ may represent the number of RWLs that have been used in the target repair region. If $N_{RWL}^{(t+1)} < 0$, it indicates that there is no available RWL, and no RWL may be adopted for WL repair processing. In S606, whether the FB feature map satisfies the second preset condition may be continued to be determined.

In S607, if the FB feature map satisfies the second preset condition, namely a second phenomenon is triggered, S608 is executed, namely BL repair processing is performed on the target repair region. Specifically, the second preset condition may be that the FB count of the first numbered BL in the basic repair bank is larger than the present remaining RWL count of the basic repair bank. For each basic repair bank in the target repair region, namely $N_{ij}^{FBLs} \in \forall M_{ri}$, when $N_{ij}^{FBLs} > N_{RWL}^{(t)}$, the WL at corresponding position j is repaired using the RBL. When WL repair is performed using the RBL, the present remaining RBL count correspondingly decreases by 1, so the present remaining RBL count may be correspondingly updated when WL repair is performed, namely $N_{RWL}^{(t+1)} = N_{RWL}^{(t)} - n_{RWL}^{(t)}$, where $N_{RWL}^{(t)}$ represents the number of the remaining available RWLs, t represents the present variable, t+1 represents the next variable, and $N_{RWL}^{(t)}$ may represent the number of the RWLs that have been used in the target repair region. If $N_{RWL}^{(t+1)} < 0$, it indicates that there is no available RWL, and no RWL may be adopted for WL repair processing. whether the FB feature map satisfies the second preset condition may be continued to be determined. $N_{RBL}^{(t+1)} = N_{RBL}^{(t)} - n_{RBL}^{(t)}$, where $N_{RBL}^{(t)}$ represents the number of the remaining available RWLs, t represents the present variable, t+1 represents the next variable, and $N_{RBL}^{(t)}$ may represent the number of RBLs that have been used in the target repair region. If $N_{RBL}^{(t+1)} < 0$, it indicates that there is no available RBL, and no RBL may be adopted for WL repair processing. In such case, in S609, whether the FB feature map satisfies the first preset condition may be continued to be cyclically determined, and if the FB feature map satisfies the first preset condition, namely a first phenomenon is triggered, S610 is executed. Whether the FB feature map satisfies the first preset condition and the second preset condition is cyclically determined to perform repair processing on the FB in the target repair region.

It is to be noted that some chips to be repaired have been repaired after first repair processing, i.e., FR processing, and thus do not need subsequent operations, and for chips that are not completely repaired after first repair processing, repair operations after initial repair processing are required to be continued. For a chip that is not completely repaired after first repair processing, the following processing operations may be continued to be executed.

In S130, after first repair processing is performed, a second FB position determination step is executed to determine a bit position of a second FB in each target repair region, and second repair processing is performed on the second FB according to the bit position of the second FB.

In some exemplary embodiments of the present disclosure, the second FB may be an FB that is not repaired after first repair processing and satisfies some preset state conditions. The second FB position determination step may be a step of determining the bit position of the second FB in each target repair region in the chip to be repaired. The bit position of the second FB may be a position of the second FB in the target repair region. Second repair processing, also called optimal must repair, may be a process that positions of some FBs may be directly determined to be repaired using the RBL or the RWL when some state conditions are satisfied, and this repair solution is definitely optimal.

Figure 7:
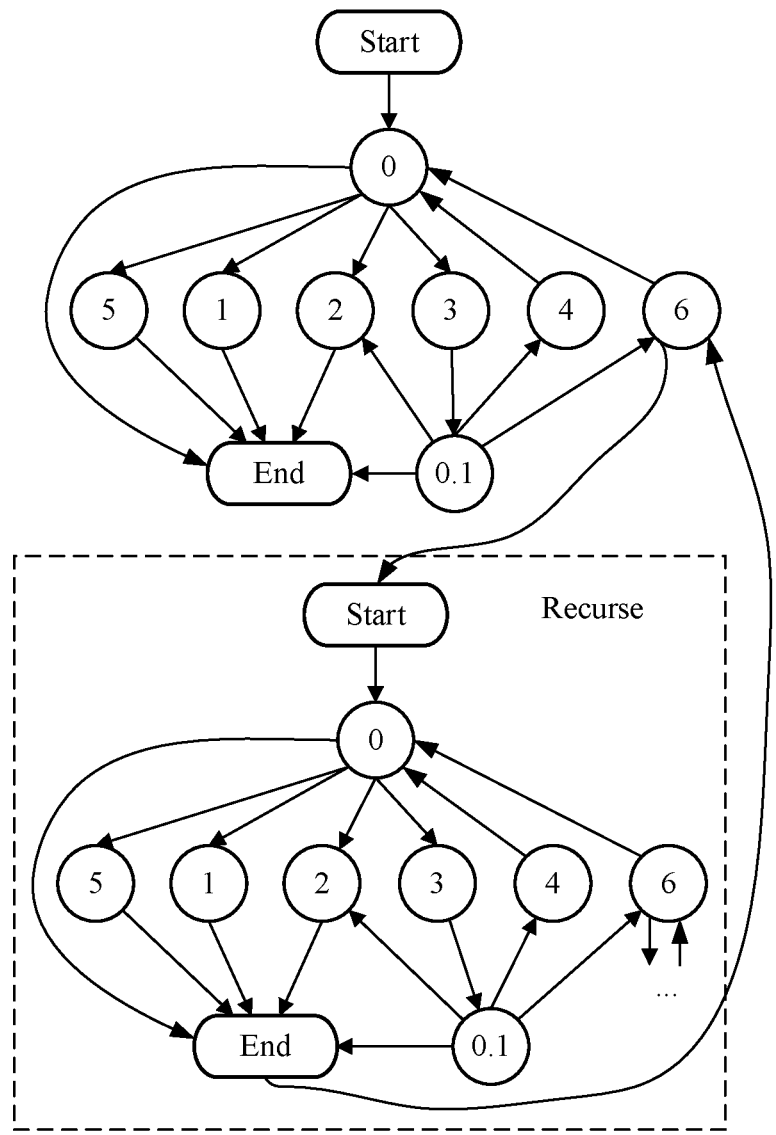
FIG. 7 schematically shows a state diagram of state determination repair processing according to an exemplary implementation of the present disclosure.

References are made to FIG. 7. FIG. 7 schematically shows a state diagram of state determination repair processing according to an exemplary implementation of the present disclosure. In FIG. 7, a state that a bank feature map corresponding to the target repair region is consistent with may be determined to perform corresponding second repair processing on the FB in the target repair region. For example, a state set of bank feature map states may include multiple different determination states such as 0, 0.1, 1, 2, 3, 4, 5, and 6.

According to some exemplary embodiment of the present disclosure, the FB feature map of the target repair region is acquired, and a target FB count, available RBL count, and present remaining RWL count of the target repair region are determined. If the target repair region satisfies an initial determination condition, a repair processing operation for the chip to be repaired is ended, the initial determination condition including that the target FB count is equal to 0, or the available RBL count is equal to 0, or the present remaining RWL count is less than 0. If the target repair region does not satisfy the initial determination condition, segmentation processing is performed on the FB feature map according to an association relationship to generate a segmenting feature map group, the segmenting feature map group including segmenting feature maps. If a bank feature map state of the target repair region is a second initial state and a new FB feature map is generated in the segmenting feature map group, the second initial state is adjusted to a first initial state.

A target repair region $A_r$ may include one or more feature map groups, and the kth map group in $A_r$ may be represented by $G_{rk}$. Herein, a presently processed feature map group, i.e., a present feature map group, may be represented by $G_c$. A vector formed by an FB count of all WBs in the present feature map group in the target repair region may be represented by $n_c^{FWL}$, and $n_{c+k}^{FWL}$ may represent a vector formed by an FB count of all WLs in the next k feature map groups in the target repair region. The available RBL count may be the number of all RBLs in the present feature map group $G_c$, and may be represented by $N_{rc}^{TRBL}$, namely $$\sum_{M_{ri} \in G_c} N_{ri}^{RBL}.$$

Associated feature maps may refer to that, if there are unrepaired FBs at the same WL position in any two feature maps, it may be considered that the two feature maps are associated, otherwise they are unassociated. A spuriously associated feature map may refer to any associated map of which an RBL count is larger than a Fail Bit Line (FBL) count, namely the RBL count>=the FBL count. FBL may represent a bit including an FB. Segmentation processing may be a process of, for each map in the map group, independently forming a new map group by associated maps and independently forming a new map group by any associated or spuriously associated maps. The target FB count may be the number of all FBs in the present feature map group, and may be represented by $N_{rc}^{FB}$. The number of the FBL under operation processing may be represented by $n^{FBL}$. An index value of an FB of a certain BL in the feature map may be represented by $y_l^{FBL}$. The segmenting feature map group may be a new feature map group generated after segmentation processing is performed on the FB feature map. The segmenting feature map may be a feature map in the segmenting feature map group, and a segmenting feature map group may include one or more segmenting feature maps. The bank feature map state may be a state corresponding to the FB feature map corresponding to the target repair region.

After first repair processing, the FB feature map corresponding to each target repair region subjected to first repair processing may be obtained, and the following processing is performed on each target repair region. A target FB count $N_{rc}^{FB}$, available RBL count $N_{rc}^{TRBL}$, and present remaining RWL count $N_{RWL}^{(t)}$ corresponding to a target repair region are acquired. If the target repair region satisfies the initial determination condition, the repair processing operation for the chip to be repaired is ended. The initial determination condition may be that the target FB count $N_{rc}^{FB}$ is equal to 0, the available RBL count $N_{rc}^{TRBL}$ is equal to 0, or the present remaining RWL count $N_{RWL}^{(t)}$ is less than 0.

If the target repair region does not satisfy the initial determination condition, segmentation processing is performed on the FB feature map according to the association relationship to generate the segmenting feature map group, namely each map group in the target repair region is segmented according to the defined association relationship. If the bank feature map state of the target repair region is the first initial state before segmentation processing, and a new segmenting feature map group is generated after the segmentation processing step, the bank feature map state of the target repair region is adjusted from the second initial state to the first initial state. In the present disclosure, the first initial state may be defined as a state corresponding to numerical value 0, and the second initial state may be defined as a state corresponding to numerical value 0.1. After segmentation processing is completed, the bank feature map state may further be determined. When the bank feature map state is the first initial state, whether the map of each group is consistent with specific states corresponding to numerical values 1, 2, 3, and 5 may be checked. If the bank feature map state is the second initial state, whether the map of each group is consistent with specific states corresponding to numerical values 2 and 4 may be checked. In addition, if state 6 exists, whether the map is consistent with the state corresponding to numerical value 6 is required to be checked. A corresponding repair operation is executed according to the state determined according to each bank feature map state, and if there is no state consistent with the bank feature map state, the repair processing operation for the chip to be repaired is ended.

Figure 8:
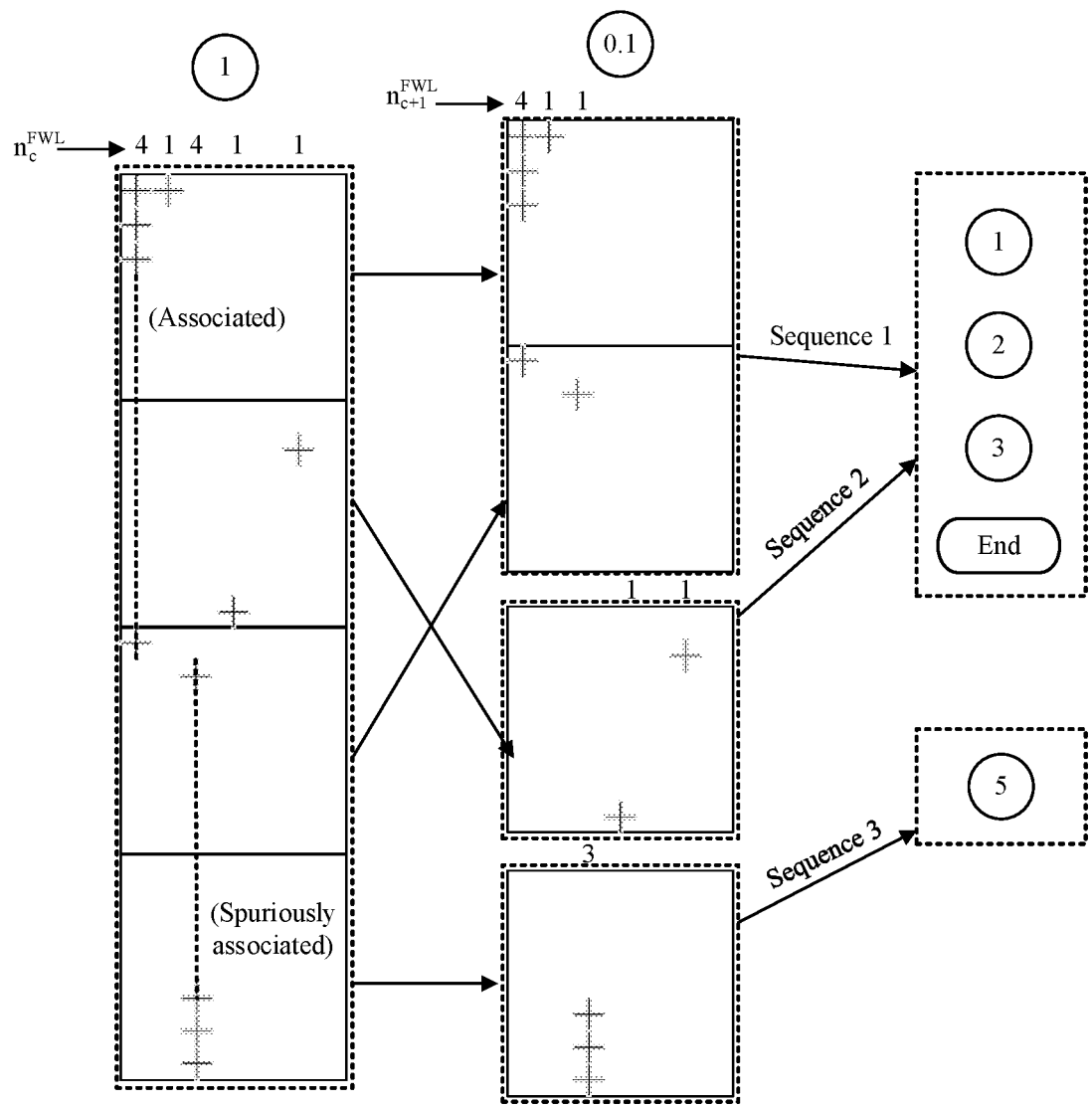
FIG. 8 schematically shows a process chart of performing segmentation processing on a feature map group according to an exemplary implementation of the present disclosure.

References are made to FIG. 8. FIG. 8 schematically shows a process chart of performing segmentation processing on a feature map group according to an exemplary implementation of the present disclosure. When corresponding segmentation processing is performed on a bank feature map that satisfies state=0.1, whether the state of the bank feature map may be switched to state=0 may be determined, a determination state that the bank feature map is consistent with is further determined according to an initial state corresponding to the bank feature map state, and second repair processing is performed on the target repair region according to the specific determination state. A specific processing process is as follows.

According to some exemplary embodiments of the present disclosure, if the bank feature map state is the first initial state, whether the bank feature map state is consistent with a first determination state in a first state set is determined, the first determination state including that the available RBL count is greater than a first preset numerical value and a maximum of FB counts on respective WLs is equal to the first preset numerical value. If the bank feature map state is consistent with the first determination state, a second repair processing step in the first determination state is executed. The second repair processing step in the first determination state includes: a repair step in the first determination state: a first maximum bit position corresponding to a first BL maximum FB in the segmenting feature map is acquired, and the first initial repair processing step is triggered to be executed to repair the FB at the first maximum bit position; and a determination step in the first determination state: whether the segmenting feature map subjected to the repair step in the first determination state satisfies a first determination condition is determined, the first determination condition including that the target FB count is greater than 0, the available RBL count is greater than 0, and a next remaining RWL count is greater than or equal to 0, and if the segmenting feature map subjected to the repair step in the first determination state satisfies the first determination condition, the repair step in the first determination state is executed.

The first preset numerical value may be a preset first numerical value. For example, the first preset numerical value may be 1. The first state set may be a set formed by states for comparison with the bank feature map state when the bank feature map state is the first initial state. The first determination state may be a predefined determination state. For example, the first determination state may be a state corresponding to state=1. A vector formed by an FB count of all BLs in the present feature map group may be represented by $n_c^{FBL}$. A vector formed by an FB count of all WLs in the present feature map group may be represented by $n_c^{FWL}$. The maximum of FB counts on respective WLs may be a maximum value in $n_c^{FWL}$, and may be represented by $\max(n_c^{FWL})$. The first determination state may be that the available RBL count is greater than the first preset numerical value and the maximum WL FB count is equal to the first preset numerical value, namely $N_{rc}^{TRBL}>1$ and $\max(n_c^{FWL})=1$. The second repair processing step in the first determination state may be a repair step for the target repair region when the bank feature map state is consistent with the first determination state. The first BL maximum FB may be a maximum value of an FB BL position number in $n_c^{FWL}$, and may be represented by $Y_c^{Max}$, where $Y_c^{Max}$ is argmax $f(y_j)$, $f(y_j)=(n_{c,y_j}^{FBL}|n_{c,y_j}^{FBL}\in n_c^{FBL})$. The first maximum bit position is a position corresponding to $Y_c^{Max}$.

Figure 9:
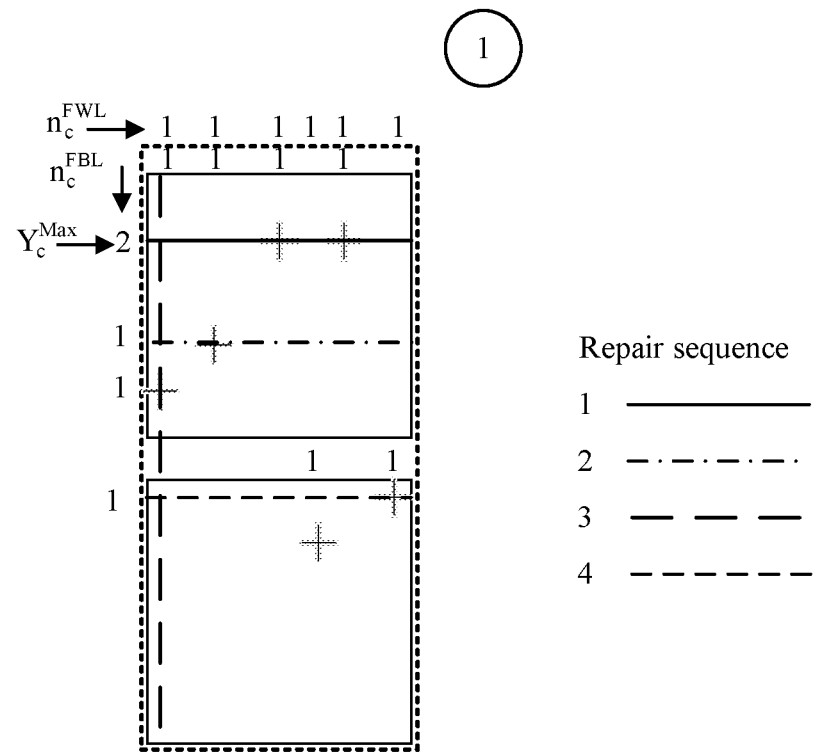
FIG. 9 schematically shows an FB feature map consistent with a first determination state according to an exemplary implementation of the present disclosure.

References are made to FIG. 9. FIG. 9 schematically shows an FB feature map consistent with a first determination state according to an exemplary implementation of the present disclosure. The FB feature map in FIG. 9 is consistent with the first determination state. FIG. 9 shows a repair sequence when repair processing is performed on FBs. If the bank feature map state is consistent with the first determination state, the second repair processing step in the first determination state is executed, including the repair step in the first determination state and the determination step in the first determination state. The following operations are specifically executed. In 1, the first maximum bit position in the segmenting feature map is acquired. In 2, the first initial repair processing step is triggered to be executed to repair the FB at the first maximum bit position. In 3, whether the segmenting feature map subjected to the repair step in the first determination state satisfies the first determination condition is determined. The first determination condition may be that the target FB count is greater than 0, the available RBL count is greater than 0, and the next remaining RWL count is greater than or equal to 0, namely $N_{rc}^{FB}>0$, $N_{rc}^{TRBL}>0$, and $N_{RWL}^{(t+1)}\geq 0$. When the segmenting feature map satisfies the first determination condition, 1 is continued to be executed, otherwise the state is terminated.

According to some exemplary embodiments of the present disclosure, if the bank feature map state is the first initial state, whether the bank feature map state is consistent with a second determination state in the first state set is determined, the second determination state including that the available RBL count is equal to the first preset numerical value. If the bank feature map state is consistent with the second determination state, a second repair processing step in the second determination state is executed. The second repair processing step in the second determination state includes that: the first maximum bit position corresponding to the first BL maximum FB in the segmenting feature map is acquired, and the first initial repair processing step is triggered to be executed to repair the FB at the first maximum bit position. The second determination state may be a predefined determination state. For example, the second determination state may be a state corresponding to state=2. The second determination state may be that the available RBL count is equal to the first preset numerical value, namely $N_{rc}^{TRBL}=1$.

Figure 10:
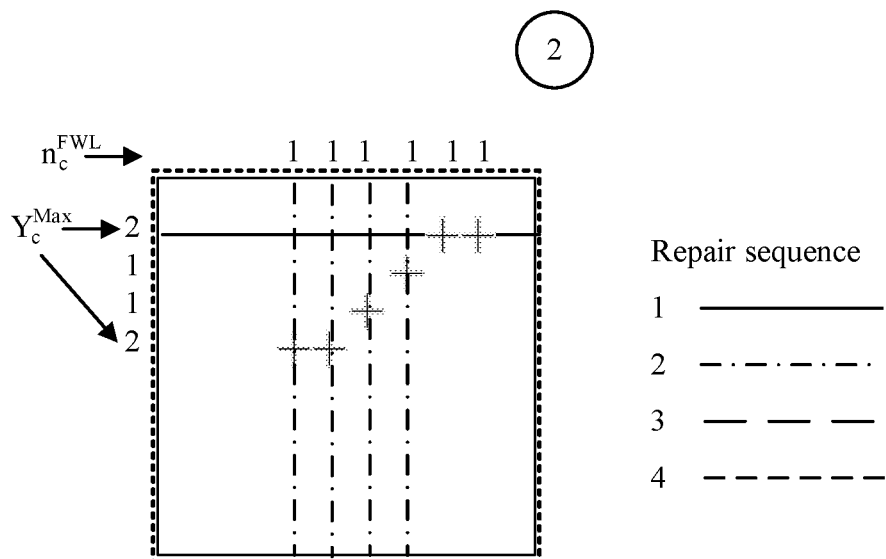
FIG. 10 schematically shows an FB feature map consistent with a second determination state according to an exemplary implementation of the present disclosure.

References are made to FIG. 10. FIG. 10 schematically shows an FB feature map consistent with a second determination state according to an exemplary implementation of the present disclosure. The FB feature map in FIG. 10 is consistent with the second determination state. If the bank feature map state is consistent with the second determination state, the second repair processing step in the second determination state is executed, including the following operations. In 1, the first maximum bit position corresponding to the first BL maximum FB in the segmenting feature map is acquired. In 2, the first initial repair processing step is triggered to be executed to repair the FB at the first maximum bit position. In 3, the state is terminated.

According to some exemplary embodiments of the present disclosure, if the bank feature map state is the first initial state, whether the bank feature map state is consistent with a third determination state in the first state set is determined, the third determination state including that the available RBL count is greater than the first preset numerical value and the maximum WL FB count is greater than the first preset numerical value. If the bank feature map state is consistent with the third determination state, a second repair processing step in the third determination state is executed. The second repair processing step in the third determination state includes: a repair step in the third determination state: the first maximum bit position corresponding to the first BL maximum FB and a second maximum bit position corresponding to a second BL maximum FB in the segmenting feature map are acquired respectively, and if the maximum bit position and the second maximum bit position include the same position, the first initial repair processing step is triggered to be executed to repair an FB at the same position; and a determination step in the third determination state: whether the segmenting feature map subjected to the repair step in the third determination state satisfies a third determination condition, the third determination condition including that the target FB count is greater than 0, the available RBL count is greater than the first preset numerical value, and the next remaining RWL count is greater than or equal to 0, and if the segmenting feature map subjected to the repair step in the third determination state satisfies the third determination condition, the repair step in the third determination state is executed.

The third determination state may be a predefined determination state. For example, the third determination state may be a state corresponding to state=3. The third determination state may be that the available RBL count is greater than the first preset numerical value and the maximum WL FB count is greater than the first preset numerical value, namely $N_{rc}^{TRBL}>1$ and $\max(n_c^{FWL})>1$. The second BL maximum FB may be the maximum number of 0s that may be added or reduced in $n_c^{FWL}$ after a certain BL in the present feature map group is repaired, i.e., a BL including most FBs in the present feature map group, and may be represented by $Y_c^{MDx}$. The same position may be an overlapping position of the first maximum bit position and the second maximum bit position.

Figure 11:
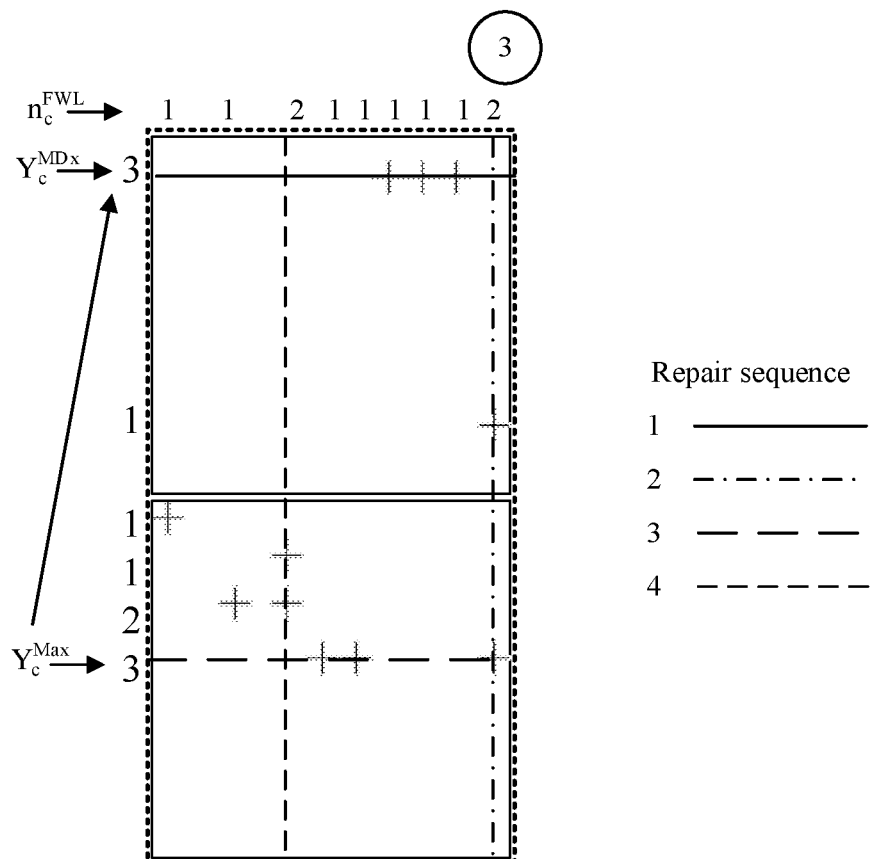
FIG. 11 schematically shows an FB feature map consistent with a third determination state according to an exemplary implementation of the present disclosure.

References are made to FIG. 11. FIG. 11 schematically shows an FB feature map consistent with a third determination state according to an exemplary implementation of the present disclosure. The FB feature map in FIG. 11 is consistent with the third determination state. If the bank feature map state is consistent with the third determination state, the second repair processing step in the third determination state is executed, including the repair step in the third determination state and the determination step in the third determination state. The following operations are specifically executed. In 1, the first maximum bit position corresponding to the first BL maximum FB and the second maximum bit position corresponding to the second BL maximum FB in the segmenting feature map are acquired respectively, namely the FBs at positions corresponding to $Y_c^{Max}$ and $Y_c^{MDx}$ are acquired respectively. In 2, whether the first maximum bit position and the second maximum bit position include the same position is determined, namely whether $Y_c^{Max} \cap Y_c^{MDx} \neq \{\ \}$ is satisfied is determined. If the positions corresponding to $Y_c^{Max}$ and $Y_c^{MDx}$ include the same position, one position is selected, and the first initial repair processing step is triggered to be executed to repair the FB corresponding to the position. Otherwise, the state is terminated. In 3, whether the segmenting feature map subjected to the repair step in the third determination state satisfies the third determination condition is determined. The third determination condition includes that the target FB count is greater than 0, the available RBL count is greater than the first preset numerical value, and the next remaining RWL count is greater than or equal to 0, namely the third determination condition may be $N_{rc}^{FB} > 0$, $N_{rc}^{TRBL} > 0$, and $N_{RWL}^{(t+1)} \geq 0$. When the segmenting feature map satisfies the third determination condition, 1 is continued to be executed, otherwise the state is terminated.

According to some exemplary embodiments of the present disclosure, if the bank feature map state is the second initial state, whether the bank feature map state is consistent with a fourth determination state in a second state set is determined, the fourth determination state including that the available RBL count is greater than the first preset numerical value and the maximum WL FB count is equal to a second preset numerical value, or the available RBL count is equal to the second preset numerical value and the maximum WL FB count is greater than the first preset numerical value. If the bank feature map state is consistent with the fourth determination state, a second repair processing step in the fourth determination state is executed. The second repair processing step in the fourth determination state includes: a repair step in the fourth determination state: a third maximum bit position corresponding to a third BL maximum FB in the segmenting feature map is acquired, and the first initial repair processing step is triggered to be executed to repair the FB at the third maximum bit position; and a determination step in the fourth determination state: whether the segmenting feature map subjected to the repair step in the fourth determination state satisfies a fourth determination condition is determined, the fourth determination condition including that the target FB count is greater than 0, the available RBL count is greater than the first preset numerical value, the FBL count is greater than the first preset numerical value, the next remaining RWL count is greater than or equal to 0, and the maximum WL FB count is equal to the second preset numerical value, and if the segmenting feature map subjected to the repair step in the fourth determination state satisfies the fourth determination condition, the second repair processing step in the fourth determination state is executed.

The fourth determination state may be a predefined determination state. For example, the fourth determination state may be a state corresponding to state=4. The second preset numerical value may be a preset second numerical value. For example, the second preset numerical value may be 2. The fourth determination state may be that the available RBL count is greater than the first preset numerical value and the maximum WL FB count is equal to the second preset numerical value, or the available RBL count is equal to the second preset numerical value and the maximum WL FB count is greater than the first preset numerical value, namely the fourth determination state is [$N_{rc}^{TRBL} > 1$ and $\max(n_c^{FWL})$ =2], or [$N_{rc}^{TRBL} = 2$ and $\max(n_c^{FWL}) > 1$]. The third BL maximum FB may be the maximum number of 0s that may be added or reduced in $n_c^{FWL}$ after one or two of some BLs in the present feature map group are repaired, and may be represented by $Y_c^{MDx2}$. The third maximum bit position is a position corresponding to $Y_c^{MDx2}$. The FBL count may be the number of FBLs in the present feature map group, and may be represented by $N_c^{FBL}$.

Figure 12:
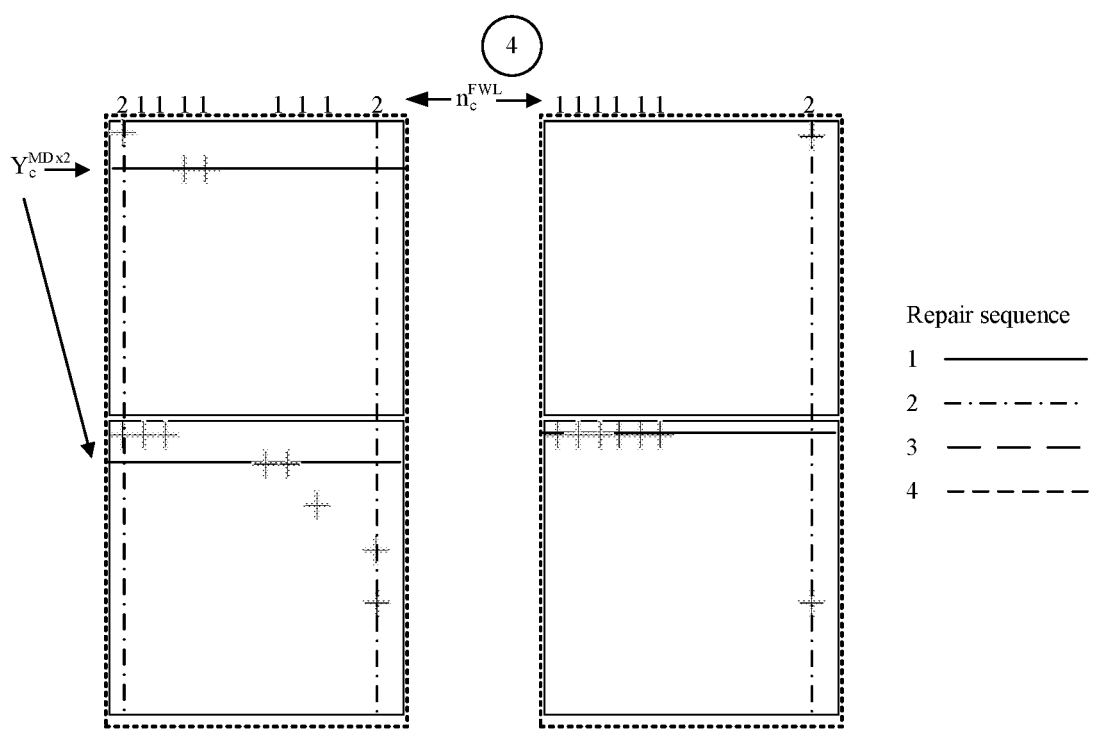
FIG. 12 schematically shows an FB feature map consistent with a fourth determination state according to an exemplary implementation of the present disclosure.

References are made to FIG. 12. FIG. 12 schematically shows an FB feature map consistent with a fourth determination state according to an exemplary implementation of the present disclosure. The FB feature map in FIG. 12 is consistent with the fourth determination state. If the bank feature map state is consistent with the fourth determination state, the second repair processing step in the fourth determination state is executed, including the repair step in the fourth determination state and the determination step in the fourth determination state. The following operations are specifically executed. In 1, the third maximum bit position corresponding to the third BL maximum FB in the segmenting feature map is acquired. In 2, the first initial repair processing step is triggered to be executed to repair the FB at the third maximum bit position. In 3, whether the segmenting feature map subjected to the repair step in the fourth determination state satisfies the fourth determination condition is determined. The fourth determination condition includes that the target FB count is greater than 0, the available RBL count is greater than the first preset numerical value, the FBL count is greater than the first preset numerical value, the next remaining RWL count is greater than or equal to 0, and the maximum WL FB count is equal to the second preset numerical value, namely the fourth determination condition may be $N_{rc}^{FB} > 0$, $N_{rc}^{TRBL} > 1$, $N_c^{FBL} > 1$, $N_{RWL}^{(t+1)} \geq 0$, and $\max(n_c^{FWL}) = 2$. If the segmenting feature map satisfies the fourth determination condition, 1 is continued to be executed, otherwise the state is terminated.

According to some exemplary embodiments of the present disclosure, if the bank feature map state is the first initial state, whether the bank feature map state is consistent with a fifth determination state in the first state set is determined, the fifth determination state including that the RBL count of the basic repair bank is greater than or equal to the FBL count. If the bank feature map state is consistent with the fifth determination state, a second repair processing step in the fifth determination state is executed. The second repair processing step in the fifth determination state includes that: a position of a used RWL is acquired, a target unrepaired FB is determined according to the position of the used RWL, the target unrepaired FB including an FB which is not located at the position of the used RWL, and the target unrepaired FB is repaired by using an RBL.

The fifth determination state may be a predefined determination state. For example, the fifth determination state may be a state corresponding to state=5. The RBL count may be the number of RBLs in an ith feature map in the basic repair bank, and may be represented by $N_{ri}^{RBL}$. The RBL count may be the number of FBLs in the ith feature map in the basic repair bank, and may be represented by $N_{ri}^{FBL}$. The position of the used RWL may be a repaired RWL position. The target unrepaired FB may include an FB which is not located at the position of the used RWL.

Figure 13:
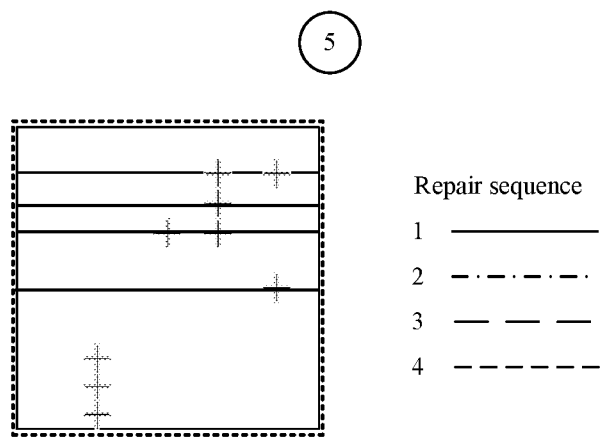
FIG. 13 schematically shows an FB feature map consistent with a fifth determination state according to an exemplary implementation of the present disclosure.

References are made to FIG. 13. FIG. 13 schematically shows an FB feature map consistent with a fifth determination state according to an exemplary implementation of the present disclosure. The FB feature map in FIG. 13 is consistent with the fifth determination state. If the bank feature map state is consistent with the fifth determination state, the second repair processing step in the fifth determination state is executed. The following operations are specifically executed. In 1, the position of the used RWL is acquired. In 2, the target unrepaired FB is determined according to the position of the used RWL, and the target unrepaired FB is repaired using the RBL. In 3, the state is terminated.

In S140, unrepaired FBs in each target repair region are determined, and the second FB position determination step is recursively executed to obtain a test repair position of each unrepaired FB to perform third repair processing on the unrepaired FB according to the test repair position.

In some exemplary embodiments of the present disclosure, the unrepaired FB may be an FB that is not repaired after second repair processing. Third repair processing, also called optimal repair, may be a process of acquiring an optimal redundant circuit allocation corresponding to a lowest repair cost in all possible repair combinations. The test repair position may be a repair position determined after the second FB position determination step is recursively executed on the unrepaired FB.

If there are still unrepaired FBs in the chip to be repaired after first repair processing and second repair processing, these FBs are determined as unrepaired FBs, the second FB position determination step is recursively executed to determine test repair positions corresponding to the unrepaired FBs, and after the test repair positions are determined, third repair processing may be performed on the unrepaired FBs according to the test repair positions.

According to some exemplary embodiments of the present disclosure, if the bank feature map state is the second initial state, whether the bank feature map state is consistent with a sixth determination state in the second state set is determined, the sixth determination state including that the available RBL count is greater than the second preset numerical value and the maximum WL FB count is greater than the second preset numerical value. If the bank feature map state is consistent with the sixth determination state, a repair processing step in the sixth determination state is executed. The repair processing step in the sixth determination state includes that: FBL serial numbers corresponding to the FB feature map are determined, positions corresponding to the FBL serial numbers are traversed one by one, and the first initial repair processing step is triggered to be executed; the second FB position determination step is recursively executed, and acquired positions to be repaired are determined as test repair positions; test repair costs corresponding to the test repair positions are calculated, and a minimum test repair cost and a target repair position corresponding to the minimum test repair cost are determined; and repair processing is performed on the target repair position by using the redundant circuit.

The sixth determination state may be a predefined determination state. For example, the sixth determination state may be a state corresponding to state=6. The sixth determination state may be that the available RBL count is greater than the second preset numerical value and the maximum WL FB count is greater than the second preset numerical value, namely $N_{rc}^{TRBL}>2$ and $\max(n_c^{FWL})>2$. The FBL number may be the number of an FBL including an FB in all feature maps in a feature map group, and may be represented by FBL number, and an initial FBL number is 0. The test repair cost may be a repair cost corresponding to repair processing performed on the FB according to the test repair position. The minimum test repair cost may be a minimum value in all test repair costs. The target repair position may be a repair position of the FB corresponding to the minimum test repair cost.

Figure 14:
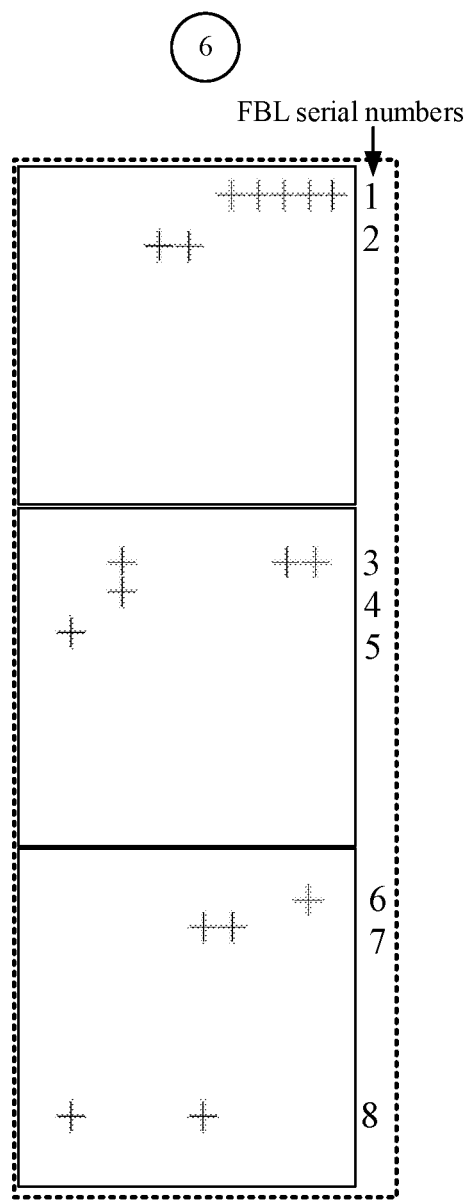
FIG. 14 schematically shows an FB feature map consistent with a sixth determination state according to an exemplary implementation of the present disclosure.

References are made to FIG. 14. FIG. 14 schematically shows an FB feature map consistent with a sixth determination state according to an exemplary implementation of the present disclosure. The FB feature map in FIG. 14 is consistent with the sixth determination state. If the bank feature map state is consistent with the sixth determination state, the second repair processing step in the sixth determination state is executed. The following operations are specifically executed. In 1, the FBL serial numbers corresponding to the FB feature map are acquired, and variable i is set to 0. In 2, i progressively increases, the positions corresponding to the FBL serial numbers are traversed one by one to clear all test repair positions, the FBL numbered with i is set as a test repair position, and the first initial repair processing step is triggered to be executed. In 3, the second FB position determination step is recursively executed, and all obtained positions to be repaired are determined as test repair positions. In 4, test repair costs $c^{(i)}$ corresponding to the test repair positions are calculated, and the costs and all repair positions $s^{(i)}$ are recorded. In 5, if i is equal to the maximum value in the FBL serial numbers, 6 is continued to be executed, otherwise 2 is executed. In 6, the minimum test repair cost and the target repair position corresponding to the minimum test repair cost are determined. The target repair position may be determined as a repair position for optimal repair. Repair processing is performed on the target repair position by using the redundant circuit, and the state is terminated. The test repair cost may be calculated using formula 1.

$$f^c(s, N_{RWL}^{(t)}) = \begin{cases} b_3 n_{RWL}^{(t)} + n_{RBL}^{(t)}, & \text{if } N_{RWL}^{(t)} - n_{RWI}^{(t)} \geq 0; \\ \infty, & \text{otherwise} \end{cases} \quad \text{(Formula 1)}$$

$b_3$ may be $$\sum_i N_{ri}^{RBL},$$

i.e., a total RBL count of each target repair region. $n_{RBL}^{(t)}$ may be the number of RBLs that have been used in the test repair position $s^{(i)}$. $n_{RWL}^{(t)}$ may be the number of RWLs that have been used in the test repair position $s^{(i)}$.

According to some exemplary embodiments of the present disclosure, repair priorities of repair processing for the unrepaired FBs are determined, and the FBs are repaired according to the repair priorities. The repair priorities include: a first repair priority, a new segmenting feature map group is generated after segmentation processing is performed on the segmenting feature map, and an RWL count of the segmenting feature map after FB repair processing is greater than the first preset numerical value; a second repair priority, after repair processing is performed on the FB, the segmenting feature map is segmented, and a new segmenting feature map group is generated; a third repair priority, after repair processing is performed on the FB in the basic repair bank, the RWL count corresponding to the basic repair bank is equal to 0; a fourth repair priority, an FBL corresponding to a maximum number value in the first BL maximum FB, or an FBL corresponding to a maximum number value in the second BL maximum FB; a fifth repair priority, the target fail WL, the target fail WL being a maximum fail WLs corresponding to the larger number value in two maximum fail WLs including FBLs; a sixth repair priority, the FB corresponding to a maximum number value in the FBL; a seventh repair priority, an RBL configured to repair FBLs and corresponding to a minimum number value in the segmenting feature map; and an eighth repair priority, the first FB that is randomly determined. The repair priority may be a priority of repair processing for the unrepaired FB, and different FBs correspond to different repair priorities. For example, the repair priorities may be set to progressively decrease from high to low priorities, namely the repair priority of the first repair priority is highest.

After the unrepaired FBs are determined, repair processing may be performed on the unrepaired FBs according to the repair priorities. For example, the repair priorities, including the first repair priority, the second repair priority to the eighth repair priority, may be predetermined in the present disclosure. Processing the unrepaired FBs using the repair priorities may reduce the operation cost effectively.

It is to be noted that terms "first", "second", "third", "fourth", "fifth", "sixth", "seventh", "eighth", etc., used in the present disclosure are only for distinguishing different FBs, different repair processing, different preset conditions, different initial states, different determination states, different preset numerical values, different determination conditions, different repair priorities, etc., and not intended to correspondingly limit the present disclosure.

According to the FB repair method of the present disclosure, on one aspect, with adoption of the FB repair method of the present disclosure, an optimal repair solution for the chip to be repaired may be determined under limited RWLs and RBLs, namely a repair solution with a minimum repair cost is determined when the chip to be repaired may really be repaired. On another aspect, positions of the first FB and the second FB may be directly determined to achieve a purpose of rapid repair. On the third aspect, for the unrepaired FBs that are not repaired after first repair processing and second repair processing, all combinations of the unrepaired FBs may be determined to determine the optimal repair solution, and third repair processing may be performed.

Figure 15:
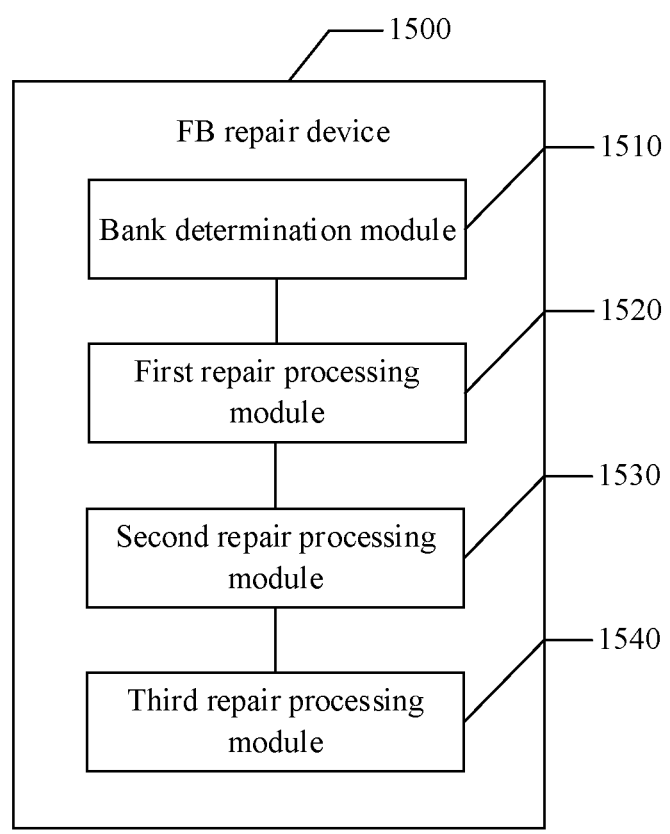
FIG. 15 schematically shows a block diagram of an FB repair device according to an exemplary implementation of the present disclosure.

In addition, there is also provided in an exemplary embodiment an FB repair device. Referring to FIG. 15, the FB repair device 1500 may include a bank determination module 1510, a first repair processing module 1520, a second repair processing module 1530, and a third repair processing module 1540.

Specifically, bank determination module 1510 is configured to determine a bank to be repaired of a chip to be repaired, the bank to be repaired including multiple target repair regions. The first repair processing module 1520 is configured to perform first repair processing on a first FB in each target repair region by using a redundant circuit. The second repair processing module 1530 is configured to, after first repair processing is performed, execute a second FB position determination step to determine a bit position of a second FB in each target repair region, and perform second repair processing on the second FB according to the bit position of the second FB. The third repair processing module 1540 is configured to determine unrepaired FBs in each target repair region, and recursively execute the second FB position determination step to obtain a test repair position of each unrepaired FB to perform third repair processing on the unrepaired FB according to the test repair position.

The FB repair device 1500 may directly determine positions of the first FB and the second FB to achieve a purpose of rapid repair. For the unrepaired FBs that are not repaired after first repair processing and second repair processing, all combinations of the unrepaired FBs may be determined to determine an optimal repair solution, and third repair processing may be performed. The optimal repair solution for the chip to be repaired may be implemented under limited RWLs and RBLs, namely a repair solution with a minimum repair cost is determined when the chip to be repaired may really be repaired.

In an exemplary implementation of the present disclosure, the FB repair device further includes a bank compression module, configured to: determine an initial bank to be repaired of the chip to be repaired, the initial bank to be repaired including an initial WL and an initial BL; acquire a WL compression ratio and BL compression ratio of the initial bank to be repaired; and perform compression processing on the initial WLs according to the WL compression ratio, and perform compression processing on the initial BLs according to the BL compression ratio, to form the bank to be repaired.

In an exemplary implementation of the present disclosure, the FB repair device further includes a bank division module, configured to determine a division column of the bank to be repaired, a width of the division column being determined according to a number of row-direction equivalent bits in a DQ after compression processing, and perform column division processing on the bank to be repaired according to the division column to form the multiple target repair regions.

In an exemplary implementation of the present disclosure, the first repair processing module includes a first repair processing unit, configured to determine an FB feature map of the target repair region, and perform first repair processing on an FB in each target repair region by using the redundant circuit according to the FB feature map.

In an exemplary implementation of the present disclosure, the first repair processing unit includes a feature map determination subunit, configured to: divide the target repair region into multiple basic repair banks, the basic repair bank including a preset number of DQs; acquire the basic repair banks, and determine bit states of all bits in the basic repair banks; perform OR operation processing on the bit states in the preset number of DQs, and generate a FB map of each basic repair bank by merging; and generate the FB feature map according to the FB maps corresponding to respective basic repair banks.

In an exemplary implementation of the present disclosure, the first repair processing unit includes a first repair processing subunit, configured to perform first repair processing on the FB in each target repair region by using the redundant circuit according to the FB feature map, including a determining step of determining whether the FB feature map satisfies a preset condition, the preset condition including a first preset condition and a second preset condition;

a first initial repair processing step of if the FB feature map satisfies the first preset condition, performing repair processing on the FB using an RWL, the first preset condition including that an FB count of a first numbered WL in the basic repair bank is larger than a present remaining RBL count of the basic repair bank; and a second initial repair processing step of if the FB feature map satisfies the second preset condition, performing repair processing on the FB by using an RBL, the second preset condition including that an FB count of a first numbered BL in the basic repair bank is larger than a present remaining RWL count of the basic repair bank.

In an exemplary implementation of the present disclosure, the FB repair device further includes an initial condition determination module, configured to: acquire the FB feature map of the target repair region, and determine a target FB count, available RBL count, and present remaining RWL count of the target repair region;

if the target repair region satisfies an initial determination condition, end a repair processing operation for the chip to be repaired, the initial determination condition including that the target FB count is equal to 0, or the available RBL count is equal to 0, or the present remaining RWL count is less than 0;

if the target repair region does not satisfy the initial determination condition, perform segmentation processing on the FB feature map according to an association relationship to generate a segmenting feature map group, the segmenting feature map group including segmenting feature maps; and if a bank feature map state of the target repair region is a second initial state and a new FB feature map is generated in the segmenting feature map group, adjusting the second initial state to a first initial state.

In an exemplary implementation of the present disclosure, the second repair processing module includes a first determination state repair unit, configured to: if the bank feature map state is the first initial state, determine whether the bank feature map state is consistent with a first determination state in a first state set, the first determination state including that the available RBL count is greater than a first preset numerical value and a maximum of FB counts on respective WLs is equal to the first preset numerical value, and if the bank feature map state is consistent with the first determination state, execute a second repair processing step in the first determination state.

The second repair processing step in the first determination state includes: a repair step in the first determination state: acquiring a first maximum bit position corresponding to a first BL maximum FB in the segmenting feature map, and triggering executing of the first initial repair processing step to repair the FB at the first maximum bit position; and a determination step in the first determination state: determining whether the segmenting feature map subjected to the repair step in the first determination state satisfies a first determination condition, the first determination condition including that the target FB count is greater than 0, the available RBL count is greater than 0, and a next remaining RWL count is greater than or equal to 0, and if the segmenting feature map subjected to the repair step in the first determination state satisfies the first determination condition, executing the repair step in the first determination state.

In an exemplary implementation of the present disclosure, the second repair processing module includes a second determination state repair unit, configured to: if the bank feature map state is the first initial state, determine whether the bank feature map state is consistent with a second determination state in the first state set, the second determination state including that the available RBL count is equal to the first preset numerical value, and if the bank feature map state is consistent with the second determination state, execute a second repair processing step in the second determination state.

The second repair processing step in the second determination state includes: acquiring the first maximum bit position corresponding to the first BL maximum FB in the segmenting feature map, and triggering executing of the first initial repair processing step to repair the FB at the first maximum bit position.

In an exemplary implementation of the present disclosure, the second repair processing module includes a third determination state repair unit, configured to: if the bank feature map state is the first initial state, determine whether the bank feature map state is consistent with a third determination state in the first state set, the third determination state including that the available RBL count is greater than the first preset numerical value and the maximum WL FB count is greater than the first preset numerical value, and if the bank feature map state is consistent with the third determination state, execute a second repair processing step in the third determination state.

The second repair processing step in the third determination state includes: a repair step in the third determination state: acquiring the first maximum bit position corresponding to the first BL maximum FB and a second maximum bit position corresponding to a second BL maximum FB in the segmenting feature map respectively, and if the maximum bit position and the second maximum bit position include the same position, triggering executing of the first initial repair processing step to repair an FB at the same position; and a determination step in the third determination state: determining whether the segmenting feature map subjected to the repair step in the third determination state satisfies a third determination condition, the third determination condition including that the target FB count is greater than 0, the available RBL count is greater than the first preset numerical value, and the next remaining RWL count is greater than or equal to 0, and if the segmenting feature map subjected to the repair step in the third determination state satisfies the third determination condition, executing the repair step in the third determination state.

In an exemplary implementation of the present disclosure, the second repair processing module includes a fourth determination state repair unit, configured to: if the bank feature map state is the second initial state, determine whether the bank feature map state is consistent with a fourth determination state in a second state set, the fourth determination state including that the available RBL count is greater than the first preset numerical value and the maximum WL FB count is equal to a second preset numerical value, or the available RBL count is equal to the second preset numerical value and the maximum WL FB count is greater than the first preset numerical value, and if the bank feature map state is consistent with the fourth determination state, execute a second repair processing step in the fourth determination state.

The second repair processing step in the fourth determination state includes: a repair step in the fourth determination state: acquiring a third maximum bit position corresponding to a third BL maximum FB in the segmenting feature map, and triggering executing of the first initial repair processing step to repair the FB at the third maximum bit position; and a determination step in the fourth determination state: determining whether the segmenting feature map subjected to the repair step in the fourth determination state satisfies a fourth determination condition, the fourth determination condition including that the target FB count is greater than 0, the available RBL count is greater than the first preset numerical value, the FBL count is greater than the first preset numerical value, the next remaining RWL count is greater than or equal to 0, and the maximum WL FB count is equal to the second preset numerical value, and if the segmenting feature map subjected to the repair step in the fourth determination state satisfies the fourth determination condition, executing the second repair processing step in the fourth determination state.

In an exemplary implementation of the present disclosure, the second repair processing module includes a fifth determination state repair unit, configured to: if the bank feature map state is the first initial state, determine whether the bank feature map state is consistent with a fifth determination state in the first state set, the fifth determination state including that the RBL count of the basic repair bank is greater than or equal to the FBL count, and if the bank feature map state is consistent with the fifth determination state, execute a second repair processing step in the fifth determination state.

The second repair processing step in the fifth determination state includes: acquiring a position of a used RWL, determining a target unrepaired FB according to the position of the used RWL, the target unrepaired FB including an FB which is not located at the position of the used RWL, and repairing the target unrepaired FB by using an RBL.

In an exemplary implementation of the present disclosure, the second repair processing module includes a third repair processing unit, configured to: if the bank feature map state is the second initial state, determine whether the bank feature map state is consistent with a sixth determination state in the second state set, the sixth determination state including that the available RBL count is greater than the second preset numerical value and the maximum WL FB count is greater than the second preset numerical value, and if the bank feature map state is consistent with the sixth determination state, execute a repair processing step in the sixth determination state.

The repair processing step in the sixth determination state includes: determining FBL serial numbers corresponding to the FB feature map, traversing positions corresponding to the FBL serial numbers one by one, and triggering executing of the first initial repair processing step; recursively executing the second FB position determination step, and determining acquired positions to be repaired as test repair positions; calculating test repair costs corresponding to the test repair positions, and determining a minimum test repair cost and a target repair position corresponding to the minimum test repair cost; and performing repair processing on the target repair position by using the redundant circuit.

In an exemplary implementation of the present disclosure, the third repair processing module further includes a priority determination unit, configured to determine repair priorities of repair processing for the unrepaired FBs, and repair the FBs according to the repair priorities. The repair priorities include: a first repair priority, a new segmenting feature map group is generated after segmentation processing is performed on the segmenting feature map, and an RWL count of the segmenting feature map after FB repair processing is greater than the first preset numerical value; a second repair priority, after repair processing is performed on the FB, the segmenting feature map is segmented, and a new segmenting feature map group is generated; a third repair priority, after repair processing is performed on the FB in the basic repair bank, the RWL count corresponding to the basic repair bank is equal to 0; a fourth repair priority, an FBL corresponding to a maximum number value in the first BL maximum FB, or an FBL corresponding to a maximum number value in the second BL maximum FB; a fifth repair priority, the target fail WL, the target fail WL being a maximum fail WLs corresponding to the larger number value in two maximum fail WLs including FBLs; a sixth repair priority, the FB corresponding to a maximum number value in the FBL; a seventh repair priority, an RBL configured to repair FBLs and corresponding to a minimum number value in the segmenting feature map; and an eighth repair priority, the first FB that is randomly determined.

Specific details about each virtual module of the FB repair device have been described in detail in the corresponding FB repair method, and thus elaborations are omitted herein.

It is to be noted that, although a plurality of modules or units of the FB repair device are mentioned in the above detailed descriptions, such division is not mandatory. In practice, features and functions of two or more modules described above may be embodied in one module or unit according to the implementations of the present disclosure. Conversely, the feature and function of one module or unit described above may further be divided into multiple modules or units for embodiment. The modules or units in the present disclosure can be implemented by one or more processors and a memory having stored thereon instructions that when executed by the processors, cause the processor to implement the functions of the modules or units.

In addition, the drawings are only schematic descriptions about processing in the method according to the exemplary embodiments of the present disclosure and not for a purpose of limitation. It is easily understood that processing shown in the drawings does not indicate or limit the time sequence of the processing. In addition, it is also easily understood that such processing may be executed, for example, in multiple modules at the same time or at different time.

Other embodiments of the present disclosure are apparent to those skilled in the art after considering the specification and practicing the present disclosure disclosed here. The application is intended to cover any transformations, uses or adaptive variations of the present disclosure, and these transformations, uses or adaptive variations follow the general principle of the present disclosure, and include common general knowledge or conventional technical means undisclosed in the present disclosure in the technical field. The specification and the embodiments are only considered as examples, and the practical scope and spirit of the present disclosure are pointed out by the claims.

It should be understood that the present disclosure is not limited to the precise structures described above and shown in the drawings, and various modifications and variations may be made without departing from the scope thereof. The scope of the present disclosure is only defined by the appended claims.

What is claimed is:

1. A Fail Bit (FB) repair method, comprising:
   determining a bank to be repaired of a chip to be repaired, the bank to be repaired comprising multiple target repair regions;
   performing first repair processing on a first FB in each target repair region by using a redundant circuit;
   after first repair processing is performed, executing a second FB position determination step to determine a bit position of a second FB in each target repair region, and performing second repair processing on the second FB according to the bit position of the second FB; and
   determining unrepaired FBs in each target repair region, and recursively executing the second FB position determination step to obtain a test repair position of each unrepaired FB to perform third repair processing on the unrepaired FB according to the test repair position;
   wherein after the determining the bank to be repaired of the chip to be repaired, the method further comprises:

determining a division column of the bank to be repaired, a width of the division column being determined according to a number of row-direction equivalent bits in a Data Queue (DQ) after compression processing; and performing column division processing on the bank to be repaired according to the division column to form the multiple target repair regions.

2. The method of claim 1, wherein prior to the determining the bank to be repaired of the chip to be repaired, the method further comprises:

determining an initial bank to be repaired of the chip to be repaired, the initial bank to be repaired comprising initial Word Lines (WLs) and initial Bit Lines (BLs);

acquiring a WL compression ratio and BL compression ratio of the initial bank to be repaired; and performing compression processing on the initial WLs according to the WL compression ratio, and performing compression processing on the initial BLs according to the BL compression ratio, to form the bank to be repaired.

3. The method of claim 1, wherein said performing first repair processing on the first FB in each target repair region by using the redundant circuit comprises:

determining an FB feature map of the target repair region; and performing first repair processing on an FB in each target repair region by using the redundant circuit according to the FB feature map.

4. The method of claim 3, wherein said determining the FB feature map of the target repair region comprises:

dividing the target repair region into multiple basic repair banks, the basic repair bank comprising a preset number of DQs;

acquiring the basic repair banks, and determining bit states of all bits in the basic repair banks;

performing OR operation processing on the bit states in the preset number of DQs, and generating a FB map of each basic repair bank by merging; and generating the FB feature map according to the FB maps corresponding to respective basic repair banks.

5. The method of claim 3, wherein the redundant circuit comprises a Redundant Word-Line (RWL) and a Redundant Bit-Line (RBL), and performing first repair processing on the FB in each target repair region by using the redundant circuit according to the FB feature map comprises:

a determining step of determining whether the FB feature map satisfies a preset condition, the preset condition comprising a first preset condition and a second preset condition;

a first initial repair processing step of performing repair processing on the FB by using the RWL if the FB feature map satisfies the first preset condition, the first preset condition comprising that an FB count of a first numbered WL in the basic repair bank is larger than a present remaining RBL count of the basic repair bank; and a second initial repair processing step of performing repair processing on the FB using the RBL if the FB feature map satisfies the second preset condition, the second preset condition comprising that an FB count of a first numbered BL in the basic repair bank is larger than a present remaining RWL count of the basic repair bank.

6. The method of claim 1, wherein prior to executing the second FB position determination step to determine the bit position of the second FB in each target repair region, the method further comprises:

acquiring the FB feature map of the target repair region, and determining a target FB count, available RBL count, and present remaining RWL count of the target repair region;

if the target repair region satisfies an initial determination condition, ending a repair processing operation for the chip to be repaired, the initial determination condition comprising that the target FB count is equal to 0, or the available RBL count is equal to 0, or the present remaining RWL count is less than 0;

if the target repair region does not satisfy the initial determination condition, performing segmentation processing on the FB feature map according to an association relationship to generate a segmenting feature map group, the segmenting feature map group comprising segmenting feature maps; and if a bank feature map state of the target repair region is a second initial state and a new FB feature map is generated in the segmenting feature map group, adjusting the second initial state to a first initial state.

7. The method of claim 6, wherein said executing the second FB position determination step to determine the bit position of the second FB in each target repair region and performing second repair processing on the second FB according to the bit position of the second FB comprises:

if the bank feature map state is the first initial state, determining whether the bank feature map state is consistent with a first determination state in a first state set, the first determination state comprising that the available RBL count is greater than a first preset numerical value and a maximum of FB counts on respective WLs is equal to the first preset numerical value; and if the bank feature map state is consistent with the first determination state, executing a second repair processing step in the first determination state, wherein the second repair processing step in the first determination state comprises:

a repair step in the first determination state: acquiring a first maximum bit position corresponding to a first BL maximum FB in the segmenting feature map, and triggering executing of the first initial repair processing step to repair the FB at the first maximum bit position; and a determination step in the first determination state: determining whether the segmenting feature map subjected to the repair step in the first determination state satisfies a first determination condition, the first determination condition comprising that the target FB count is greater than 0, the available RBL count is greater than 0, and a next remaining RWL count is greater than or equal to 0, and if the segmenting feature map subjected to the repair step in the first determination state satisfies the first determination condition, executing the repair step in the first determination state.

8. The method of claim 6, wherein said executing the second FB position determination step to determine the bit position of the second FB in each target repair region and performing second repair processing on the second FB according to the bit position of the second FB comprises:

if the bank feature map state is the first initial state, determining whether the bank feature map state is consistent with a second determination state in the first state set, the second determination state comprising that the available RBL count is equal to the first preset numerical value; and if the bank feature map state is consistent with the second determination state, executing a second repair processing step in the second determination state, wherein the second repair processing step in the second determination state comprises:

acquiring the first maximum bit position corresponding to the first BL maximum FB in the segmenting feature map; and triggering executing of the first initial repair processing step to repair the FB at the first maximum bit position.

9. The method of claim 6, wherein said executing the second FB position determination step to determine the bit position of the second FB in each target repair region and performing second repair processing on the second FB according to the bit position of the second FB comprises:

if the bank feature map state is the first initial state, determining whether the bank feature map state is consistent with a third determination state in the first state set, the third determination state comprising that the available RBL count is greater than the first preset numerical value and the maximum WL FB count is greater than the first preset numerical value; and if the bank feature map state is consistent with the third determination state, executing a second repair processing step in the third determination state, wherein the second repair processing step in the third determination state comprises:

a repair step in the third determination state: acquiring the first maximum bit position corresponding to the first BL maximum FB and a second maximum bit position corresponding to a second BL maximum FB in the segmenting feature map respectively, and if the maximum bit position and the second maximum bit position comprise a same position, triggering executing of the first initial repair processing step to repair an FB at the same position; and a determination step in the third determination state: determining whether the segmenting feature map subjected to the repair step in the third determination state satisfies a third determination condition, the third determination condition comprising that the target FB count is greater than 0, the available RBL count is greater than the first preset numerical value, and the next remaining RWL count is greater than or equal to 0, and if the segmenting feature map subjected to the repair step in the third determination state satisfies the third determination condition, executing the repair step in the third determination state.

10. The method of claim 6, wherein said executing the second FB position determination step to determine the bit position of the second FB in each target repair region and performing second repair processing on the second FB according to the bit position of the second FB comprises:

if the bank feature map state is the second initial state, determining whether the bank feature map state is consistent with a fourth determination state in a second state set, the fourth determination state comprising that the available RBL count is greater than the first preset numerical value and the maximum WL FB count is equal to a second preset numerical value, or the available RBL count is equal to the second preset numerical value and the maximum WL FB count is greater than the first preset numerical value; and if the bank feature map state is consistent with the fourth determination state, executing a second repair processing step in the fourth determination state, wherein the second repair processing step in the fourth determination state comprises:

a repair step in the fourth determination state: acquiring a third maximum bit position corresponding to a third BL maximum FB in the segmenting feature map, and triggering executing of the first initial repair processing step to repair the FB at the third maximum bit position; and a determination step in the fourth determination state: determining whether the segmenting feature map subjected to the repair step in the fourth determination state satisfies a fourth determination condition, the fourth determination condition comprising that the target FB count is greater than 0, the available RBL count is greater than the first preset numerical value, a Fail Bit Line (FBL) count is greater than the first preset numerical value, the next remaining RWL count is greater than or equal to 0, and the maximum WL FB count is equal to the second preset numerical value, and if the segmenting feature map subjected to the repair step in the fourth determination state satisfies the fourth determination condition, executing the second repair processing step in the fourth determination state.

11. The method of claim 6, wherein said executing the second FB position determination step to determine the bit position of the second FB in each target repair region and performing second repair processing on the second FB according to the bit position of the second FB comprises:

if the bank feature map state is the first initial state, determining whether the bank feature map state is consistent with a fifth determination state in the first state set, the fifth determination state comprising that the RBL count of the basic repair bank is greater than or equal to the FBL count; and if the bank feature map state is consistent with the fifth determination state, executing a second repair processing step in the fifth determination state, wherein the second repair processing step in the fifth determination state comprises:

acquiring a position of a used RWL, determining a target unrepaired FB according to the position of the used RWL, the target unrepaired FB comprising an FB which is not located at the position of the used RWL, and repairing the target unrepaired FB by using an RBL.

12. The method of claim 1, wherein said determining the unrepaired FBs in each target repair region and recursively executing the second FB position determination step to obtain the test repair position of each unrepaired FB to perform third repair processing on the unrepaired FB according to the test repair position comprises:

if the bank feature map state is the second initial state, determining whether the bank feature map state is consistent with a sixth determination state in the second state set, the sixth determination state comprising that the available RBL count is greater than the second preset numerical value and the maximum WL FB count is greater than the second preset numerical value; and if the bank feature map state is consistent with the sixth determination state, executing a repair processing step in the sixth determination state, wherein the repair processing step in the sixth determination state comprises:

determining FBL serial numbers corresponding to the FB feature map, traversing positions corresponding to the FBL serial numbers one by one, and triggering executing of the first initial repair processing step;
recursively executing the second FB position determination step, and determining acquired positions to be repaired as test repair positions;
calculating test repair costs corresponding to the test repair positions, and determining a minimum test repair cost and a target repair position corresponding to the minimum test repair cost; and
performing repair processing on the target repair position by using the redundant circuit.

13. The method of claim 1, further comprising:
determining repair priorities of repair processing for the unrepaired FBs, and repairing the FBs according to the repair priorities,
wherein the repair priorities comprise:
a first repair priority, a new segmenting feature map group is generated after segmentation processing is performed on the segmenting feature map, and an RWL count of the segmenting feature map after FB repair processing is greater than the first preset numerical value;
a second repair priority, after repair processing is performed on the FB, the segmenting feature map is segmented, and a new segmenting feature map group is generated;
a third repair priority, after repair processing is performed on the FB in the basic repair bank, the RWL count corresponding to the basic repair bank is equal to 0;
a fourth repair priority, an FBL corresponding to a maximum number value in the first BL maximum FB, or an FBL corresponding to a maximum number value in the second BL maximum FB;
a fifth repair priority, a target fail WL, the target fail WL being a maximum fail WLs corresponding to the larger number value in two maximum fail WLs comprising FBLs;
a sixth repair priority, the FB corresponding to a maximum number value in the FBL;
a seventh repair priority, an RBL configured to repair FBLs and corresponding to a minimum number value in the segmenting feature map; and
an eighth repair priority, a first FB that is randomly determined.

14. A Fail Bit (FB) repair device, comprising:
a memory for storing instructions; and
a processor configured to execute the instructions to perform operations of:
determining a bank to be repaired of a chip to be repaired, the bank to be repaired comprising multiple target repair regions;
performing first repair processing on a first FB in each target repair region by using a redundant circuit;
after first repair processing is performed, executing a second FB position determination step to determine a bit position of a second FB in each target repair region, and perform second repair processing on the second FB according to the bit position of the second FB; and
determining unrepaired FBs in each target repair region, and recursively execute the second FB position determination step to obtain a test repair position of each unrepaired FB to perform third repair processing on the unrepaired FB according to the test repair position;
wherein the processor is further configured to execute the instructions to:

after determining the bank to be repaired of the chip to be repaired, determine a division column of the bank to be repaired, a width of the division column being determined according to a number of row-direction equivalent bits in a Data Queue (DQ) after compression processing; and
perform column division processing on the bank to be repaired according to the division column to form the multiple target repair regions.

15. The FB repair device of claim 14, wherein the processor is further configured to execute the instructions to:
before determining the bank to be repaired of the chip to be repaired, determine an initial bank to be repaired of the chip to be repaired, the initial bank to be repaired comprising initial Word Lines (WLs) and initial Bit Lines (BLs);
acquire a WL compression ratio and BL compression ratio of the initial bank to be repaired; and
perform compression processing on the initial WLs according to the WL compression ratio, and performing compression processing on the initial BLs according to the BL compression ratio, to form the bank to be repaired.

16. The FB repair device of claim 14, wherein said performing first repair processing on the first FB in each target repair region by using the redundant circuit comprises:
determining an FB feature map of the target repair region; and
performing first repair processing on an FB in each target repair region by using the redundant circuit according to the FB feature map.

17. The FB repair device of claim 16, wherein said determining the FB feature map of the target repair region comprises:
dividing the target repair region into multiple basic repair banks, the basic repair bank comprising a preset number of DQs;
acquiring the basic repair banks, and determining bit states of all bits in the basic repair banks;
performing OR operation processing on the bit states in the preset number of DQs, and generating a FB map of each basic repair bank by merging; and
generating the FB feature map according to the FB maps corresponding to respective basic repair banks.

18. The FB repair device of claim 16, wherein the redundant circuit comprises a Redundant Word-Line (RWL) and a Redundant Bit-Line (RBL), and performing first repair processing on the FB in each target repair region by using the redundant circuit according to the FB feature map comprises:
a determining step of determining whether the FB feature map satisfies a preset condition, the preset condition comprising a first preset condition and a second preset condition;
a first initial repair processing step of performing repair processing on the FB by using the RWL if the FB feature map satisfies the first preset condition, the first preset condition comprising that an FB count of a first numbered WL in the basic repair bank is larger than a present remaining RBL count of the basic repair bank; and
a second initial repair processing step of performing repair processing on the FB using the RBL if the FB feature map satisfies the second preset condition, the second preset condition comprising that an FB count of a first numbered BL in the basic repair bank is larger than a present remaining RWL count of the basic repair bank.

19. A Fail Bit (FB) repair method, comprising:

determining a bank to be repaired of a chip to be repaired, the bank to be repaired comprising multiple target repair regions;

performing first repair processing on a first FB in each target repair region by using a redundant circuit;

after first repair processing is performed, executing a second FB position determination step to determine a bit position of a second FB in each target repair region, and performing second repair processing on the second FB according to the bit position of the second FB; and determining unrepaired FBs in each target repair region, and recursively executing the second FB position determination step to obtain a test repair position of each unrepaired FB to perform third repair processing on the unrepaired FB according to the test repair position;

wherein said determining the unrepaired FBs in each target repair region and recursively executing the second FB position determination step to obtain the test repair position of each unrepaired FB to perform third repair processing on the unrepaired FB according to the test repair position comprises:

if the bank feature map state is the second initial state, determining whether the bank feature map state is consistent with a sixth determination state in the second state set, the sixth determination state comprising that the available RBL count is greater than the second preset numerical value and the maximum WL FB count is greater than the second preset numerical value; and if the bank feature map state is consistent with the sixth determination state, executing a repair processing step in the sixth determination state, wherein the repair processing step in the sixth determination state comprises:

determining FBL serial numbers corresponding to the FB feature map, traversing positions corresponding to the FBL serial numbers one by one, and triggering executing of the first initial repair processing step;

recursively executing the second FB position determination step, and determining acquired positions to be repaired as test repair positions;

calculating test repair costs corresponding to the test repair positions, and determining a minimum test repair cost and a target repair position corresponding to the minimum test repair cost; and performing repair processing on the target repair position by using the redundant circuit.

* * * * *